United States Patent
Cha et al.

(10) Patent No.: US 9,799,591 B2
(45) Date of Patent: Oct. 24, 2017

(54) SEMICONDUCTOR PACKAGES INCLUDING THERMAL BLOCKS

(71) Applicant: Samsung Electronics Co., Ltd., Suwon-si, Gyeonggi-do (KR)

(72) Inventors: Seung-Yong Cha, Hwaseong-si (KR); Keung Beum Kim, Hwaseong-si (KR); Yonghoon Kim, Suwon-si (KR); HyunJong Moon, Seoul (KR); Heeseok Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/825,831

(22) Filed: Aug. 13, 2015

(65) Prior Publication Data

US 2016/0133542 A1    May 12, 2016

(30) Foreign Application Priority Data

Nov. 12, 2014    (KR) .......................... 10-2014-0157411

(51) Int. Cl.
*H01L 23/00* (2006.01)
*H01L 23/50* (2006.01)
(Continued)

(52) U.S. Cl.
CPC .... *H01L 23/49827* (2013.01); *H01L 23/3677* (2013.01); *H01L 23/49816* (2013.01); *H01L 23/49822* (2013.01); *H01L 24/17* (2013.01); *H01L 25/105* (2013.01); *H01L 23/50* (2013.01); *H01L 2224/16227* (2013.01); *H01L 2224/16235* (2013.01); *H01L 2224/16245* (2013.01); *H01L 2224/16265* (2013.01); *H01L 2224/1713* (2013.01); *H01L 2225/1023* (2013.01);
(Continued)

(58) Field of Classification Search
CPC .......... H01L 23/49827; H01L 23/4983; H01L 24/17; H01L 2224/16235; H01L 2924/19041; H01L 23/49838
See application file for complete search history.

(56) References Cited

U.S. PATENT DOCUMENTS 6,075,285 A * 6/2000 Taylor ............... H01L 23/49822
                                                    257/691
6,265,672 B1    7/2001 Eum et al.
(Continued)

FOREIGN PATENT DOCUMENTS

JP    07038197 A    2/1995
JP    2013538010 A   10/2013
(Continued)

*Primary Examiner* — Mohsen Ahmadi
(74) *Attorney, Agent, or Firm* — Harness, Dickey & Pierce P.L.C.

(57) ABSTRACT

A semiconductor package includes a package substrate including a first region, a thermal block penetrating the first region and exposed at top and bottom surfaces of the package substrate, a semiconductor chip on the package substrate, bumps disposed between the package substrate and the semiconductor chip and including first bumps being in contact with the thermal block, and terminals disposed on the bottom surface of the package substrate and including first terminals being in contact with the thermal block. The thermal block is one of a power path and a ground path.

18 Claims, 17 Drawing Sheets

(51) Int. Cl.
    *H01L 23/367*     (2006.01)
    *H01L 23/498*     (2006.01)
    *H01L 25/10*     (2006.01)

(52) U.S. Cl.
    CPC .............. *H01L 2225/1058* (2013.01); *H01L 2225/1094* (2013.01); *H01L 2924/15311* (2013.01); *H01L 2924/15331* (2013.01); *H01L 2924/19041* (2013.01)

(56) References Cited

U.S. PATENT DOCUMENTS

| | | | |
|---|---|---|---|
| 6,346,743 B1* | 2/2002 | Figueroa | H01L 23/642 257/678 |
| 7,326,858 B2 | 2/2008 | Lee et al. | |
| 7,749,812 B2 | 7/2010 | Chainer | |
| 7,763,973 B1 | 7/2010 | Bratkovski et al. | |
| 8,063,483 B2 | 11/2011 | Dimitrakopoulos et al. | |
| 8,218,330 B2* | 7/2012 | Bang | H05K 1/0231 361/761 |
| 8,518,743 B2 | 8/2013 | Hsu et al. | |
| 8,581,390 B2 | 11/2013 | Travis et al. | |
| 8,792,240 B2 | 7/2014 | Feng et al. | |
| 8,796,841 B2 | 8/2014 | Travis et al. | |
| 8,970,516 B2 | 3/2015 | Black et al. | |
| 9,147,643 B2 | 9/2015 | You et al. | |
| 2002/0185718 A1 | 12/2002 | Mikubo et al. | |
| 2008/0000061 A1* | 1/2008 | Jeong | H01G 4/232 29/25.41 |
| 2008/0128854 A1* | 6/2008 | Augustine | H01G 4/30 257/532 |
| 2008/0315401 A1 | 12/2008 | Imamura et al. | |
| 2010/0140779 A1* | 6/2010 | Lin | H01L 23/49816 257/690 |
| 2010/0258905 A1* | 10/2010 | Song | H01L 23/66 257/532 |
| 2012/0139108 A1* | 6/2012 | Kim | H01L 23/49822 257/738 |
| 2013/0032934 A1* | 2/2013 | Fisch | H01L 23/5384 257/698 |
| 2013/0200513 A1* | 8/2013 | Wu | H01L 24/81 257/737 |
| 2013/0258623 A1* | 10/2013 | Zeng | H05K 1/186 361/763 |
| 2013/0292808 A1* | 11/2013 | Yen | H01L 23/552 257/660 |
| 2014/0367860 A1* | 12/2014 | Im | H01L 25/105 257/774 |
| 2015/0187745 A1* | 7/2015 | Chiu | H01L 25/18 257/738 |
| 2015/0195905 A1* | 7/2015 | Kang | H05K 1/162 361/763 |
| 2016/0066414 A1* | 3/2016 | Jow | H01L 23/49838 361/767 |
| 2016/0143149 A1* | 5/2016 | Su | H05K 1/188 174/251 |

FOREIGN PATENT DOCUMENTS

| | | |
|---|---|---|
| KR | 100195512 B1 | 6/1999 |
| KR | 20120009563 A | 2/2012 |
| KR | 20140128536 A | 11/2014 |

* cited by examiner

SEMICONDUCTOR PACKAGES INCLUDING THERMAL BLOCKS

CROSS-REFERENCE TO RELATED APPLICATION

This U.S. non-provisional patent application claims priority under 35 U.S.C. §119 to Korean Patent Application No. 10-2014-0157411, filed on Nov. 12, 2014, in the Korean Intellectual Property Office, the disclosure of which is hereby incorporated by reference in its entirety.

BACKGROUND

The inventive concepts relate to semiconductor packages. More particularly, the inventive concepts relate to semiconductor packages with improved electrical characteristics.

As performance of electronic products has been improved, heat energy generated from devices included in the electronic products has been increased. To solve this generation problem, performance of the device may be limited to adjust a temperature of the device when the temperature of the device is equal to or higher than a desired, or alternatively predetermined temperature. However, the performance of the device may be often limited by the generated heat energy, so the efficiency of the device may be reduced.

SUMMARY

Embodiments of the inventive concepts may provide semiconductor packages capable of improving electrical characteristics.

In one example embodiment, a semiconductor package may include a package substrate including a first region, a thermal block penetrating the first region of the package substrate, the thermal block exposed at a top surface and a bottom surface of the package substrate, a semiconductor chip disposed on the package substrate, bumps disposed between the package substrate and the semiconductor chip, the bumps including first bumps being in contact with the thermal block, and terminals disposed on the bottom surface of the package substrate and including first terminals being in contact with the thermal block. The thermal block may be one of a power path and a ground path.

In an embodiment, the package substrate may further include a second region spaced apart from the first region, and the semiconductor package may further include a second thermal block penetrating the second region of the package substrate.

In an embodiment, the bumps may further include second bumps, and the terminals may further include second terminals. The second bumps and the second terminals may be in contact with the second thermal block.

In an embodiment, the second thermal block may be the other of the power path and the ground path.

In an embodiment, the first bumps may include first edge bumps vertically overlapping with an outermost region of the first region, and the bumps may further include third bumps surrounding the first edge bumps in a plan view. The second bumps may include second edge bumps vertically overlapping with an outermost region of the second region, and the bumps may further include fourth bumps surrounding the second edge bumps in a plan view.

In an embodiment, the package substrate may include first interconnecting parts electrically connecting the third bumps to some of the terminals, and second interconnecting parts electrically connecting the fourth bumps to others of the terminals. Each of the thermal block and the second interconnecting part may be one of the power path and the ground path, and each of the second thermal block and the first interconnecting part may be the other of the power path and the ground path.

In an embodiment, the first terminals may include first edge terminals vertically overlapping with the outermost region of the first region, and the terminals may include third terminals surrounding the first edge terminals in a plan view. The second terminals may include second edge terminals vertically overlapping with the outermost region of the second region, and the terminals may include fourth terminals surrounding the second edge terminals in a plan view. The third terminals may be the terminals connected to the first interconnecting parts, and the fourth terminals may be the terminals connected to the second interconnecting parts.

In an embodiment, the package substrate comprises first interconnecting parts electrically connecting the third bumps to some of the terminals, and second interconnecting parts electrically connecting the fourth bumps to others of the terminals. The second thermal block may be one of the power path and the ground path, and each of the first and second interconnecting parts may be the other of the power path and the ground path.

In an embodiment, the first terminals may include first edge terminals vertically overlapping with the outermost region of the first region, and the second terminals may include second edge terminals vertically overlapping with the outermost region of the second region. The terminals may include third terminals surrounding the first edge terminals and the second edge terminals in a plan view. The third terminals may be the terminals connected to the first and second interconnecting parts.

In an embodiment, the first bumps may include first edge bumps vertically overlapping with an outermost region of the first region, and the bumps may further include second bumps surrounding the first edge bumps in a plan view. The second bumps may be connected to the other of the power path and the ground path.

In another example embodiment, a semiconductor package may include a package substrate including a first region and a second region; a first thermal block penetrating the first region of the package substrate, the first thermal block exposed at a top surface and a bottom surface of the package substrate, a second thermal block penetrating the second region of the package substrate, the second thermal block exposed at the top surface and the bottom surface of the package substrate, a semiconductor chip disposed on the package substrate, and bumps disposed between the package substrate and the semiconductor chip. The bumps may include first bumps in contact with the first thermal block and second bumps in contact with the second thermal block. A voltage difference may occur between the first bumps and the second bumps when the semiconductor package is operated.

In example embodiments, a semiconductor package includes a package substrate including at least one thermal block, a semiconductor chip on the package substrate, a plurality of bumps at a first surface of the package substrate between the package substrate and the semiconductor chip, and a plurality of terminals at a second surface of the package substrate, at least one of the plurality of bumps being in electrical contact with at least one of the plurality of terminals.

BRIEF DESCRIPTION OF THE DRAWINGS

The inventive concepts will become more apparent in view of the attached drawings and accompanying detailed description.

DETAILED DESCRIPTION

Figure 1A:
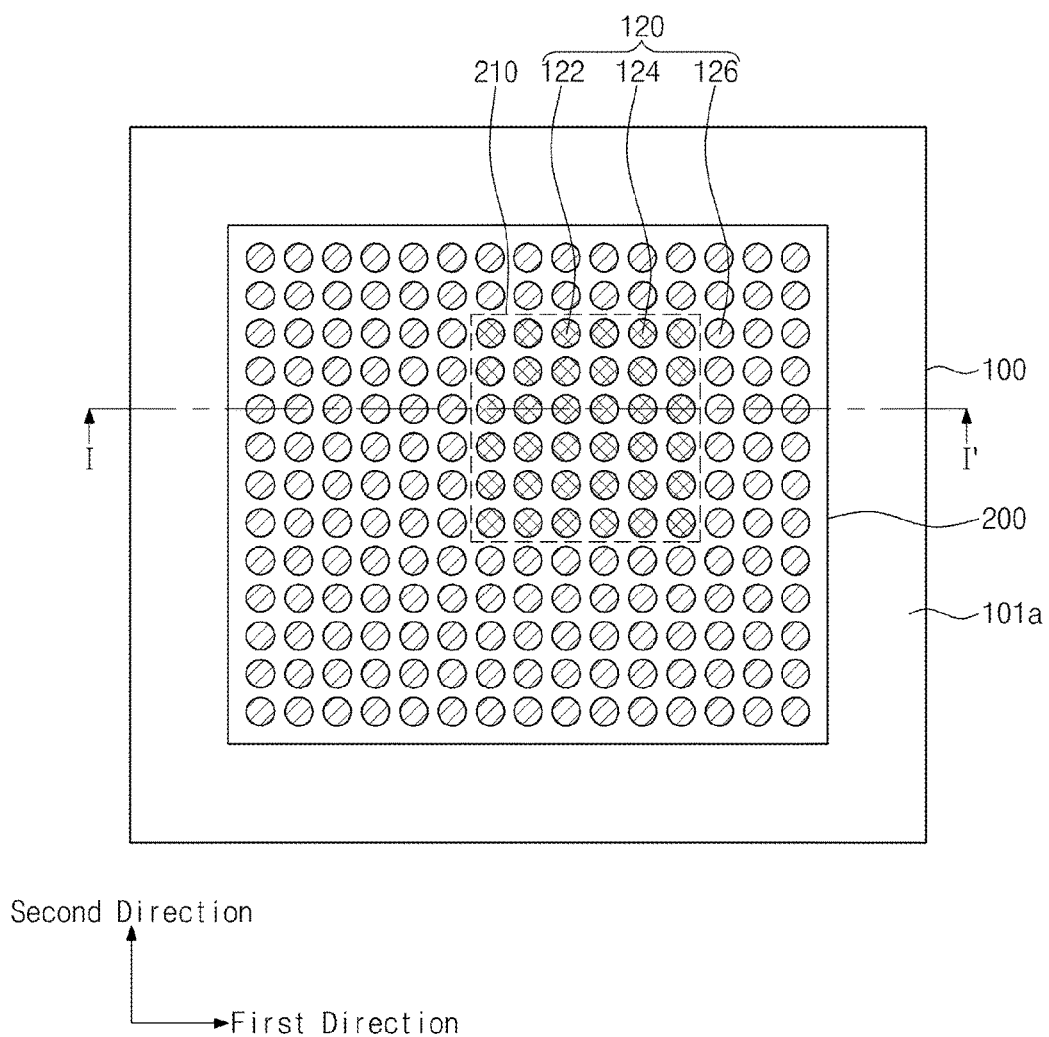
FIGS. 1A and 1B are plan views illustrating a semiconductor package according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on," "connected" or "coupled" to another element, it can be directly on, connected or coupled to the other element or intervening elements may be present. In contrast, the term "directly" means that there are no intervening elements. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts. In the drawing figures, the dimensions of layers and regions may be exaggerated for clarity of illustration Like reference numerals refer to like elements throughout. The same reference numbers indicate the same components throughout the specification.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments of example embodiments of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various example embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 1B:
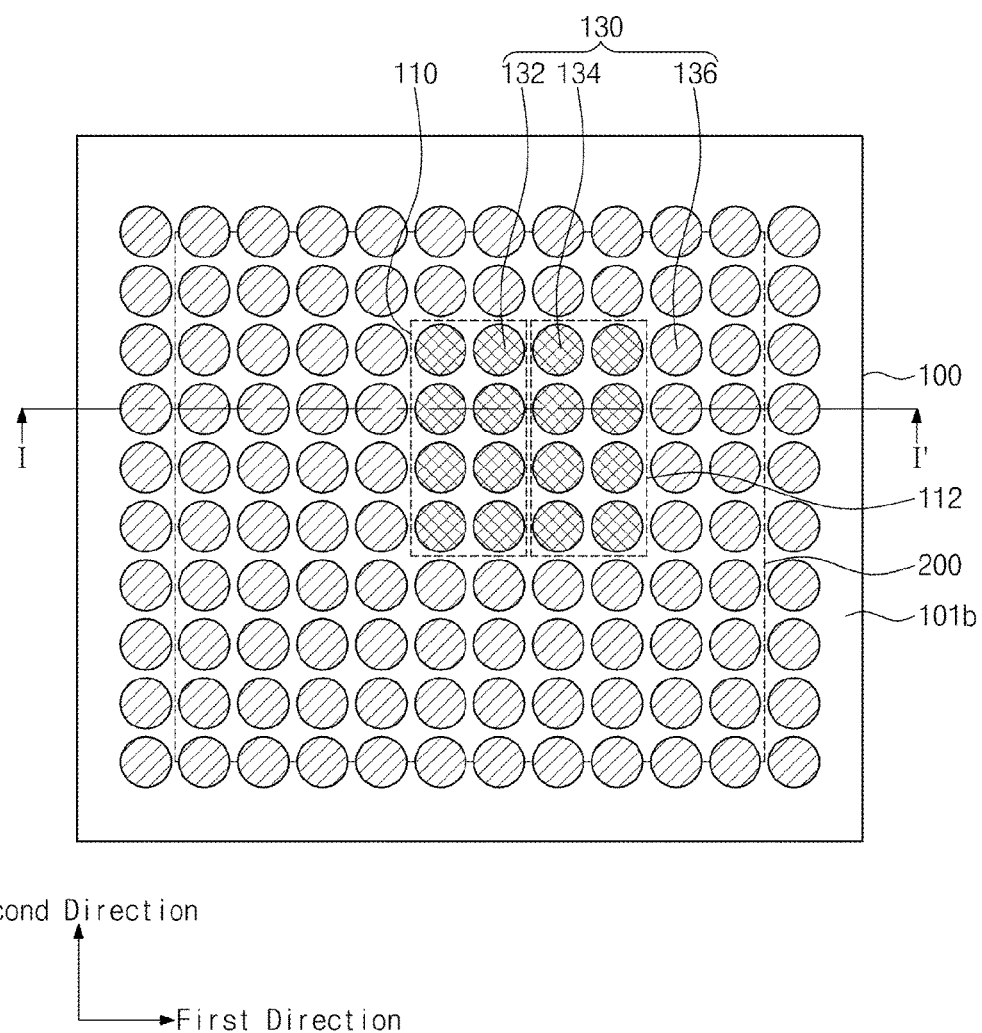
Figure 2:
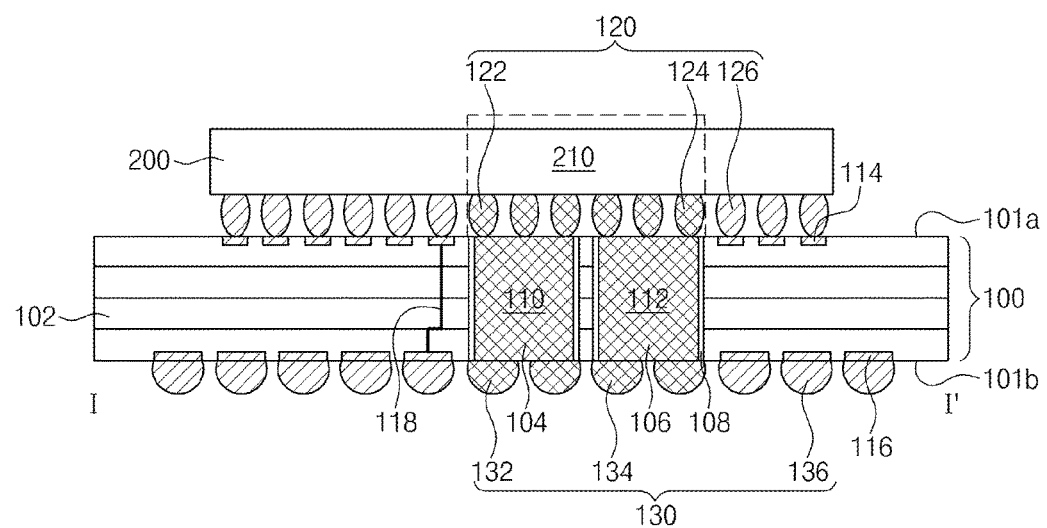
FIG. 2 is a cross-sectional view taken along a line I-I' of FIGS. 1A and 1B to illustrate a semiconductor package according to a first example embodiment of the inventive concepts.

FIGS. 1A and 1B are plan views illustrating a semiconductor package according to some example embodiments of the inventive concepts. FIG. 2 is a cross-sectional view taken along a line I-I' of FIGS. 1A and 1B to illustrate a semiconductor package according to a first example embodiment of the inventive concepts.

Referring to FIGS. 1A, 1B, and 2, a semiconductor chip 200 may be disposed on a package substrate 100. The package substrate 100 may be a printed circuit board, a flexible substrate, or a tape substrate. In some example embodiments, the package substrate 100 may be formed of or include copper-clad laminates, so the package substrate 100 may include a plurality of metal layers (not shown). The metal layers may include metal patterns (not shown). An insulating layer 102 may be disposed between the metal layers. The package substrate 100 may include a top surface 101a and a bottom surface 101b.

A first thermal block 104 and a second thermal block 106 may be disposed in the package substrate 100. The first thermal block 104 and the second thermal block 106 may be spaced apart from each other and may penetrate the package substrate 100. The first thermal block 104 and the second thermal block 106 may be respectively disposed in a first region 110 and a second region 112 of the package substrate 100 that vertically overlap with a hot spot area 210 of the semiconductor chip 200. A top surface of the first thermal block 104 may be exposed at the top surface 101a of the package substrate 100, and a bottom surface of the first thermal block 104 may be exposed at the bottom surface 101b of the package substrate 100. For example, the top surface of the first thermal block 104 may be disposed at the substantially same level as the top surface 101a of the package substrate 100, and the bottom surface of the first thermal block 104 may be disposed at the substantially same level as the bottom surface 101b of the package substrate 100. In other words, the top surface of the first thermal block 104 may be substantially coplanar with the top surface 101a of the package substrate 100, and the bottom surface of the first thermal block 104 may be substantially coplanar with the bottom surface 101b of the package substrate 100. A top surface of the second thermal block 106 may be exposed at the top surface 101a of the package substrate 100, and a bottom surface of the second thermal block 106 may be exposed at the bottom surface 101b of the package substrate 100. For example, the top surface of the second thermal block 106 may be disposed at the substantially same level as the top surface 101a of the package substrate 100, and the bottom surface of the second thermal block 106 may be disposed at the substantially same level as the bottom surface 101b of the package substrate 100. In other words, the top surface of the second thermal block 106 may be substantially coplanar with the top surface 101a of the package substrate 100, and the bottom surface of the second thermal block 106 may be substantially coplanar with the bottom surface 101b of the package substrate 100. A barrier layer 108 may be disposed between the package substrate 100 and each of the first and second thermal blocks 104 and 106. The barrier layer 108 may electrically insulate each of the first and second thermal blocks 104 and 106 from the metal layers included in the package substrate 100. The first and second thermal blocks 104 and 106 may include, for example, at least one of copper, tungsten, or aluminum. The barrier layer 108 may include, for example, at least one of a silicon oxide layer, a silicon nitride layer, or a silicon oxynitride layer.

The semiconductor chip 200 may be mounted on the top surface 101a of the package substrate 100 by a flip chip bonding technique. Terminals or bumps 120 may be disposed between the semiconductor chip 200 and the top surface 101a of the package substrate 100. A plurality of redistribution lines (not shown) may be disposed on a bottom surface of the semiconductor chip 200. The redistribution lines may be in contact with the bumps 120, respectively. The semiconductor chip 200 may be, for example, a logic chip. The logic chips may include elements (e.g., a transistor) and a plurality of circuit areas. At least one of the circuit areas may correspond to the hot spot area 210. The hot spot area 210 of the semiconductor chip 200 may be an area that includes, for example, at least one of a central processing unit (CPU), a graphic processing unit (GPU), a memory interface unit, or a universal serial bus (USB).

The terminals or bumps 120 may be arranged in a first direction and a second direction perpendicular to the first direction when viewed from a plan view. The bumps 120 may include first bumps 122, second bumps 124, and third bumps 126. The first bumps 122 and the second bumps 124 may overlap with the hot spot area 210 of the semiconductor chip 200 when viewed from a plan view. In more detail, the first bumps 122 may be in electrical contact with the first thermal block 104, and the second bumps 124 may be in electrical contact with the second thermal block 106. The third bumps 126 may be in electrical contact with chip pads 114 that are disposed on the top surface 101a of the package substrate 100. The third bumps 126 may not be disposed between the first bumps 122 and the second bumps 124 nearest to the first bumps 122. Each of the first bumps 122 may be one of a power terminal or bump and a ground terminal or bump, and each of the second bumps 124 may be the other of the terminal or power bump and the terminal or ground bump. A voltage difference may occur between the first bump 122 and the second bump 124 when the semiconductor package is operated. For example, if the first terminal or bump 122 is the power terminal or bump, the second terminal or bump 124 may be the ground terminal or bump. The third terminals or bumps 126 may be signal terminals or bumps.

Terminals 130 may be disposed on the bottom surface 101b of the package substrate 100. The terminals 130 may be arranged in the first direction and the second direction when viewed from a plan view. The terminals 130 may include first terminals 132, second terminals 134, and third terminals 136. The first terminals 132 may be in electrical contact with the first thermal block 104, so the first bumps 122 may be electrically connected to the first terminals 132 through the first thermal block 104. The second terminals 134 may be in electrical contact with the second thermal block 106, so the second bumps 124 may be electrically connected to the second terminals 134 through the second thermal block 106. The third terminals 136 may be in electrical contact with terminal pads 116 that are disposed on the bottom surface 101b of the package substrate 100. The third bumps 126 may be electrically connected to the third terminals 136 through signal interconnection parts 118.

The third terminals 136 may not be disposed between the first terminals 132 and the second terminals 134 nearest to the first terminals 132. Each of the first terminals 132 may be one of a power terminal and a ground terminal, and each of the second terminals 134 may be the other of the power terminal and the ground terminal. A voltage difference may occur between the first terminals 132 and the second terminals 134 when the semiconductor package is operated. For example, if the first terminal 132 is the power terminal, the second terminal 134 may be the ground terminal. The third terminals 136 may be signal terminals.

If the first bump 122 and the first terminal 132 are the power bump and the power terminal, respectively, the first thermal block 104 may be a power path. If the second bump 124 and the second terminal 134 are the ground bump and the ground terminal, respectively, the second thermal block 106 may be a ground path. The signal interconnection part 118 may correspond to a signal transmission path.

The first and second thermal blocks 104 and 106 may have a function that exhausts heat generated from the semiconductor chip 200 to the outside of the semiconductor package. The first and second thermal blocks 104 and 106 may be insulated from the package substrate 100 by the barrier layer 108 and may be connected to the bumps 120 and the terminals 130. Thus, each of the first and second thermal blocks 104 and 106 may perform the heat-exhausting function and may be used as one of a power connection portion and a ground connection portion. For example, if the first thermal block 104 is used as the power path, the first bumps 122 and the first terminals 132 which are in contact with the first thermal block 104 may be used as the power bumps and the power terminals, respectively. If the second thermal block 106 is used as the ground path, the second bumps 124 and the second terminals 134 which are in contact with the second thermal block 106 may be used as the ground bumps and the ground terminals, respectively. In other words, the first and second thermal blocks 104 and 106 may be used as heat-exhausting paths, and the bumps and terminals being in contact with the first and second thermal blocks 104 and 106 may be used as the power and ground bumps and the power and ground terminals, so that an area of the package substrate 100 may be effectively and optimally used. In addition, since the first and second thermal blocks 104 and 106 are adjacent to each other, a distance between the power and the ground may be short. As a result, power characteristics of the semiconductor package may be improved. For example, a Loop-L value between the power and the ground may be reduced to improve characteristics of a power voltage and a ground voltage.

Figure 3:
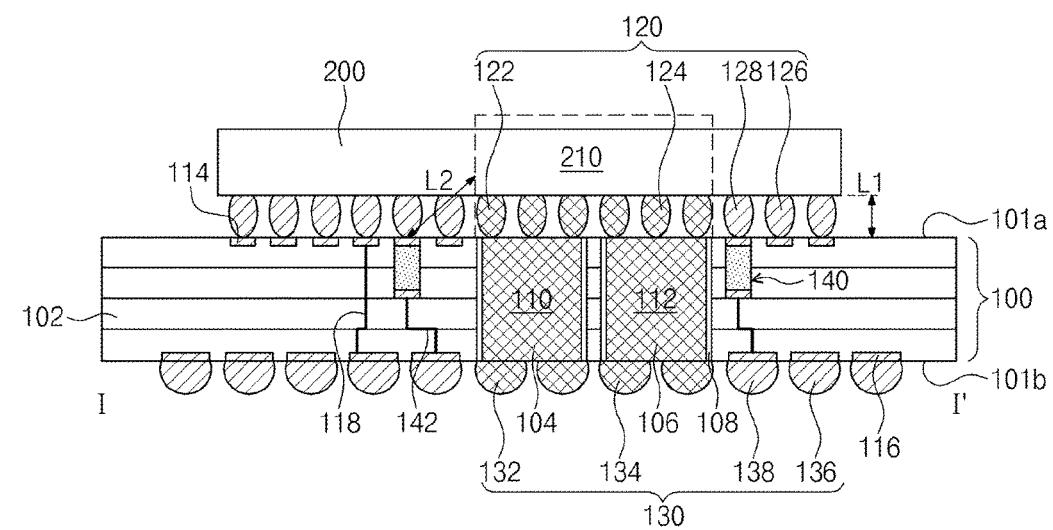
FIG. 3 is a cross-sectional view taken along a line I-I' of FIGS. 1A and 1B to illustrate a semiconductor package according to an example embodiment of the inventive concepts.

FIG. 3 is a cross-sectional view taken along a line I-I' of FIGS. 1A and 1B to illustrate a semiconductor package according to an example embodiment of the inventive concepts. In the present example embodiment, the same elements as described in the first example embodiment will be indicated by the same reference numerals or the same reference designators. For the purpose of ease and convenience in explanation, the descriptions to the same elements as in the first example embodiment will be omitted or mentioned briefly.

Referring to FIG. 3, bumps 120 may further include a fourth bump 128 and terminals 130 may further include a fourth terminal 138. The fourth bump 128 and the fourth terminal 138 may be connected to a capacitor 140. In more detail, the capacitor 140 may be embedded in the package substrate 100. The capacitor 140 may include two electrodes and a dielectric layer disposed between the two electrodes. One of the two electrodes may be a chip pad 114 which is in contact with the fourth bump 128, and the other of the two electrodes may be electrically connected to the fourth terminal 138 through an interconnection 142.

Since the first and second thermal blocks 104 and 106 are disposed in the package substrate 100, a distance L1 between the hot spot area 210 and the thermal blocks 104 and 106 may be smaller than a distance L2 between the hot spot area 210 and the capacitor 140.

The capacitor 140 may be mounted in the package substrate 100 to improve power integrity (PI) of the semiconductor package. The first and second thermal blocks 104 and 106 may be disposed in a portion, adjacent to the semiconductor chip 200, of the package substrate 100, so the capacitor 140 may be far away from the circuit area of the semiconductor chip 200. Thus, the power integrity of the semiconductor package may be deteriorated. However, according to example embodiments of the inventive concepts, the first bumps 122 and the first terminals 132 connected to the first thermal block 104 may be used as the power bumps and the power terminals, and the second bumps 124 and the second terminals 134 connected to the second thermal block 106 may be used as the ground bumps and the ground terminals. In other words, the distance between the power and the ground may be reduced to improve the power characteristics of the power and the ground, as described above. As a result, the power integrity of the semiconductor package may not be deteriorated even though the distance between the capacitor 140 and the semiconductor chip 200 increases.

Figure 4:
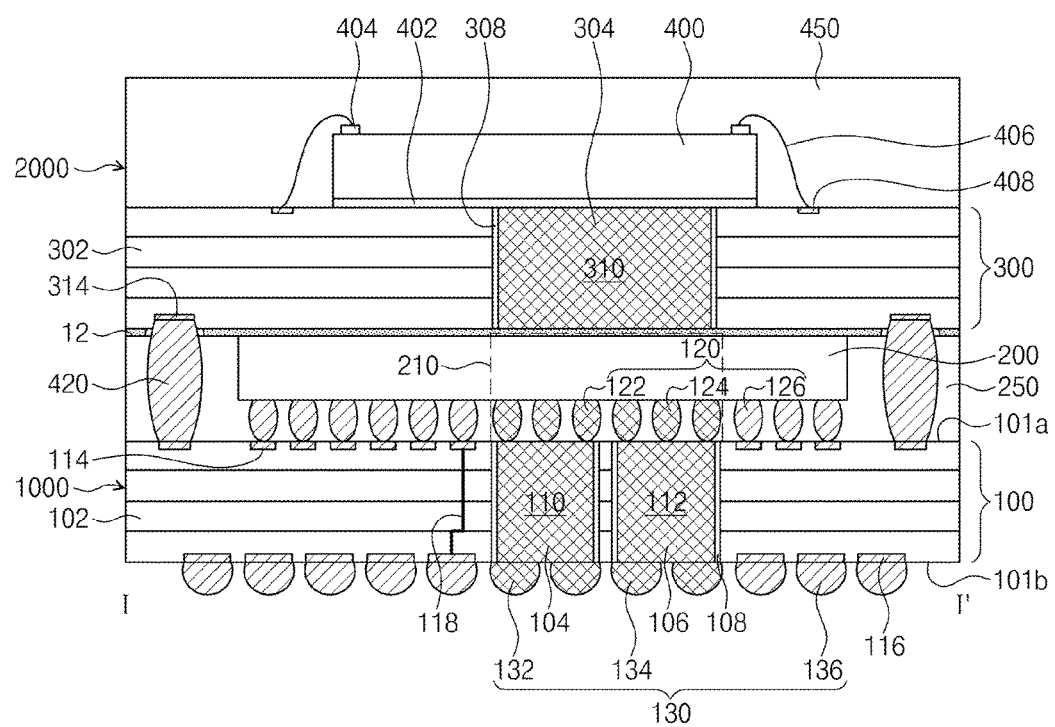
FIG. 4 is a cross-sectional view taken along a line I-I' of FIGS. 1A and 1B to illustrate a semiconductor package according to an example embodiment of the inventive concepts.

FIG. 4 is a cross-sectional view taken along a line I-I' of FIGS. 1A and 1B to illustrate a semiconductor package according to an example embodiment of the inventive concepts. In the example embodiment, the same elements as described in the example embodiment of FIGS. 1A and 1B will be indicated by the same reference numerals or the same reference designators. For the purpose of ease and convenience in explanation, the descriptions to the same elements as in the first example embodiment will be omitted or mentioned briefly.

Referring to FIG. 4, an upper package 2000 may be stacked on a lower package 1000. The lower package 1000 may include a lower package substrate 100, a lower semiconductor chip 200 disposed on the lower package substrate 100, and a lower molding layer 250.

The lower package substrate 100 may be formed of or include copper-clad laminates, so it may include a plurality of metal layers (not shown). The metal layers may consist of or include metal patterns (not shown). A lower insulating layer 102 may be disposed between the metal layers. The lower package substrate 100 may include a top surface 101a and a bottom surface 101b.

A first thermal block 104 and a second thermal block 106 may be disposed in the lower package substrate 100. The first thermal block 104 and the second thermal block 106 may be spaced apart from each other and penetrate the lower package substrate 100. The first thermal block 104 and the second thermal block 106 may be respectively disposed in first and second regions 110 and 112 of the lower package substrate 100 that are adjacent to a hot spot area 210 of the lower semiconductor chip 200. A lower barrier layer 108 may be disposed between the lower package substrate 100 and each of the first and second thermal blocks 104 and 106.

The lower semiconductor chip 200 may be mounted on the top surface 101a of the lower package substrate 100. In more detail, the lower semiconductor chip 200 may be mounted on the lower package substrate 100 by a flip chip bonding technique with bumps 120 interposed therebetween. The bumps 120 may include first bumps 122, second bumps 124, and third bumps 126. The first bumps 122 may be in electrical contact with the first thermal block 104, and the second bumps 124 may be in electrical contact with the second thermal block 106. The third bumps 126 may be in electrical contact with chip pads 114 that are disposed on the top surface 101a of the lower package substrate 100. Each of the first bumps 122 may be one of a power terminal or bump and a ground terminal or bump, and each of the second bumps 124 may be the other of the power terminal or bump and the ground terminal or bump. A voltage difference may occur between the first bump 122 and the second bump 124 when the lower package 1000 is operated. For example, if the first bumps 122 are the power terminals or bumps, the second bumps 124 may be the ground terminals or bumps. The third bumps 126 may be signal terminals or bumps.

Terminals 130 may be disposed on the bottom surface 101b of the lower package substrate 100. The terminals 130 may include first terminals 132, second terminals 134, and third terminals 136. The first terminals 132 may be in electrical contact with the first thermal block 104, so the first bumps 122 may be electrically connected to the first terminals 132 through the first thermal block 104. The second terminals 134 may be in electrical contact with the second thermal block 106, so the second bumps 124 may be electrically connected to the second terminals 134 through the second thermal block 106. Each of the first terminals 132 may be one of a power terminal and a ground terminal, and each of the second terminals 134 may be the other of the power terminal and the ground terminal. A voltage difference may occur between the first terminals 132 and the second terminals 134 when the lower package 1000 is operated. For example, if the first terminals 132 are the power terminal, the second terminals 134 may be the ground terminals. The third bumps 126 may be electrically connected to the third terminals 136 through signal interconnection parts 118. The third terminals 136 may be signal terminals.

The lower molding layer 250 may be disposed on the lower package substrate 100 to cover the lower semiconductor chip 200 and the bumps 120. The lower molding layer 250 may expose a top surface of the lower semiconductor chip 200.

The upper package 2000 may include an upper package substrate 300, an upper semiconductor chip 400 disposed on the upper package substrate 300, and an upper molding layer 450. The upper package substrate 300 may be, for example, a printed circuit board, a flexible substrate, or a tape substrate. In an example embodiment, the upper package substrate 300 may be formed of or include copper-clad laminates, so the upper package substrate 300 may include a plurality of metal layers. The metal layers may consist of or include interconnections (not shown). An upper insulating layer 302 may be disposed between the interconnections.

A third thermal block 304 may be disposed in the upper package substrate 300. The third thermal block 304 may penetrate the upper package substrate 300. A top surface and a bottom surface of the third thermal block 304 may be exposed at a top surface and a bottom surface of the upper package substrate 300, respectively. The third thermal block 304 may be disposed in a third region 310 of the upper package substrate 300 that vertically overlaps with the hot spot area 210 of the lower semiconductor chip 200. An upper barrier layer 308 may be disposed between the third thermal block 304 and the upper package substrate 300. The third region 310 of the upper package substrate 300 may face the first and second regions 110 and 112 of the lower package substrate 100. In other words, the third region 310 of the upper package substrate 300 may vertically overlap with the first and second regions 110 and 112 of the lower package substrate 100. Alternatively, even though not shown in the drawings, the third region 310 of the upper package substrate 300 may not face the first and second regions 110 and 112 of the lower package substrate 100.

The upper semiconductor chip 400 may be disposed on the upper package substrate 300. The upper semiconductor chip 400 may be mounted on the top surface of the upper package substrate 300 with an adhesive layer 402 interposed therebetween. The upper semiconductor chip 400 may be, for example, a memory chip. Chip pads 404 may be disposed on a top surface of the upper semiconductor chip 400, and bonding pads 408 may be disposed on the top surface of the upper package substrate 300. The chip pads 404 may be electrically connected to the bonding pads 408 through bonding wires 406.

The upper molding layer 450 covering the upper semiconductor chip 400 may be disposed on the upper package substrate 300. Heat generated from the lower semiconductor chip 200 may be exhausted through the third thermal block 304 as well as the first and second thermal blocks 104 and 106.

Package interconnection parts 420 may be disposed between the lower package 1000 and the upper package 2000. The package interconnection parts 420 may be in contact with some of the chip pads 114 of the lower package substrate 100 and chip pads 314 of the upper package substrate 300 to electrically connect the lower package 1000 to the upper package 2000.

A heat transmission layer 121 may be disposed between the lower package 1000 and the upper package 2000. The heat transmission layer 121 may include a thermal interface material (TIM). Heat diffused toward the upper package 2000 may be effectively transmitted to the third thermal block 304 through the heat transmission layer 121.

Figure 5A:
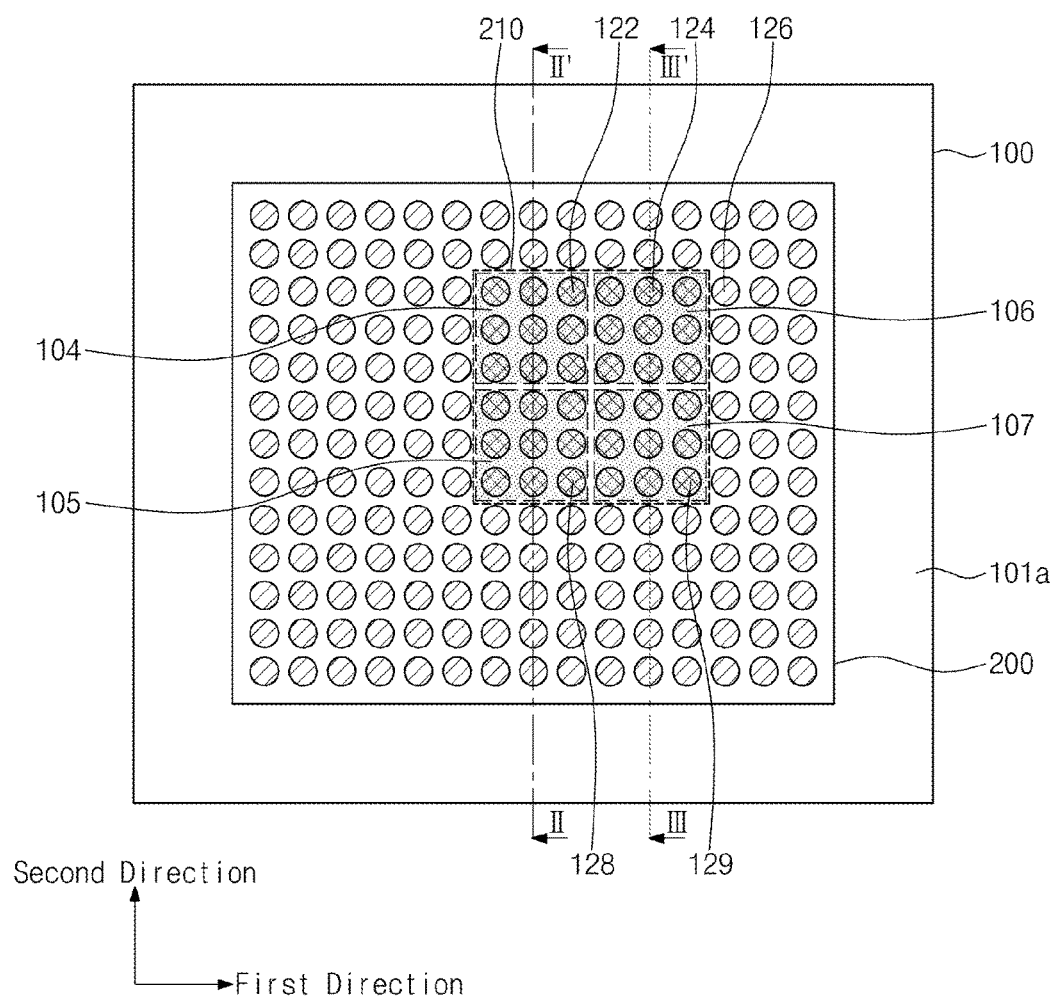
FIGS. 5A and 5B are plan views illustrating a semiconductor package according to an example embodiment of the inventive concepts.
Figure 5B:
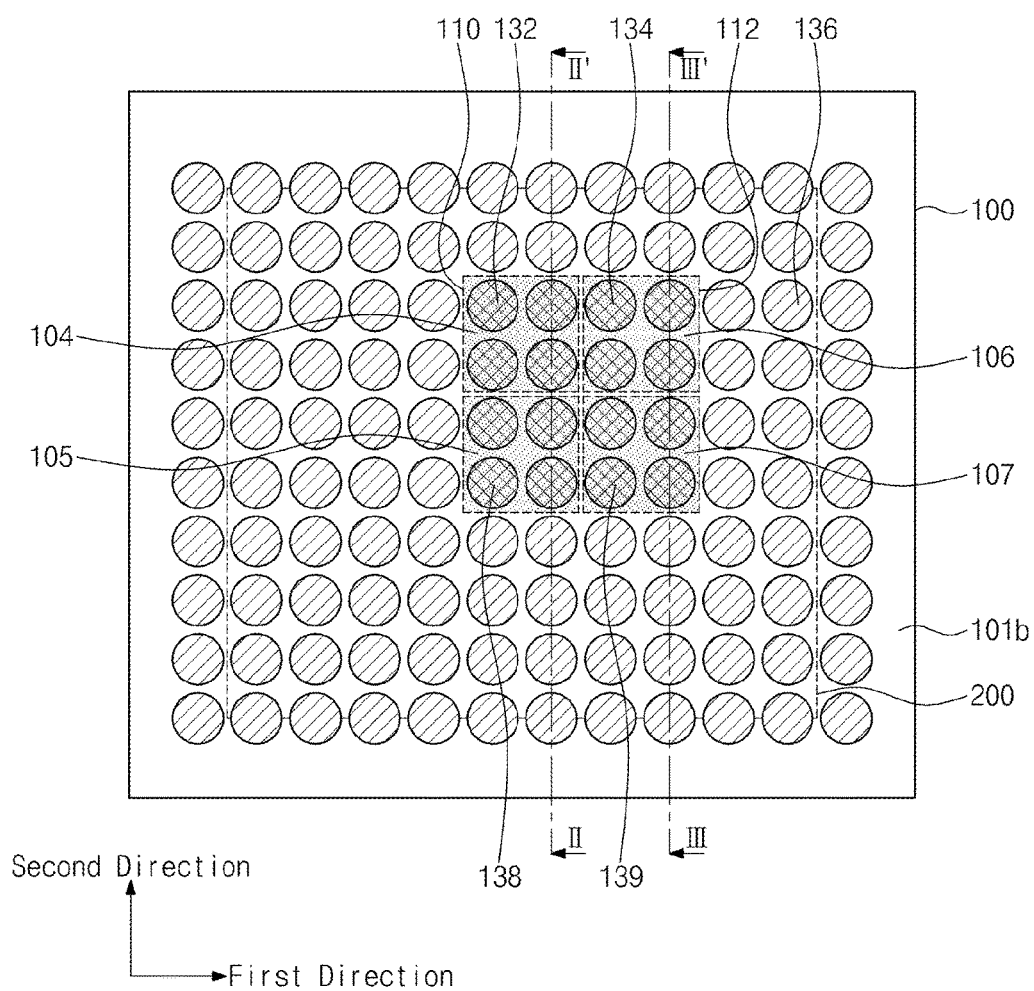
Figure 6A:
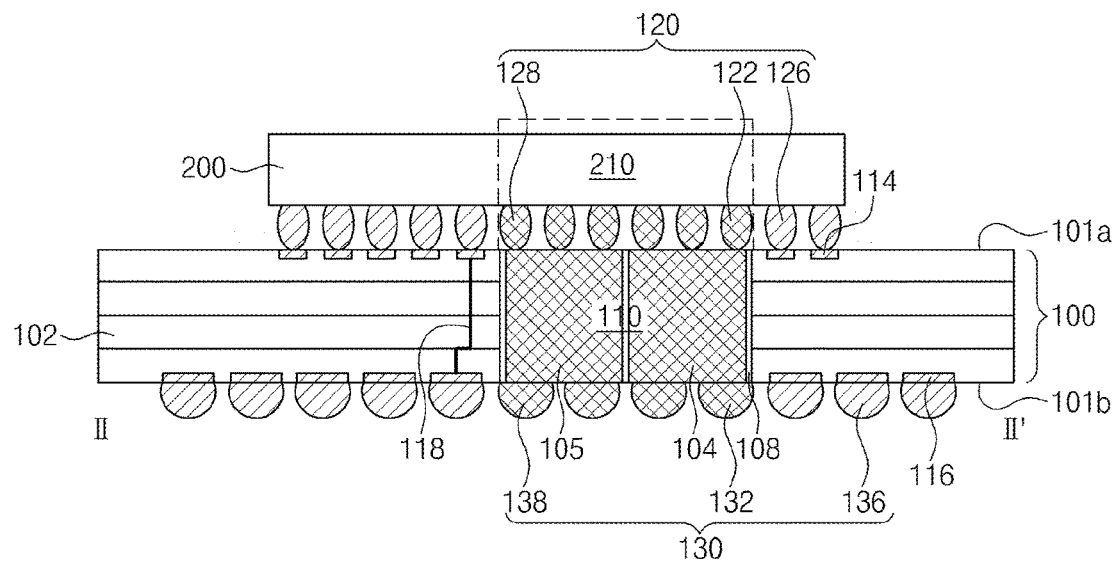
FIG. 6A is a cross-sectional view taken along a line II-II' of FIGS. 5A and 5B to illustrate the semiconductor package according to an example embodiment of the inventive concepts.
Figure 6B:
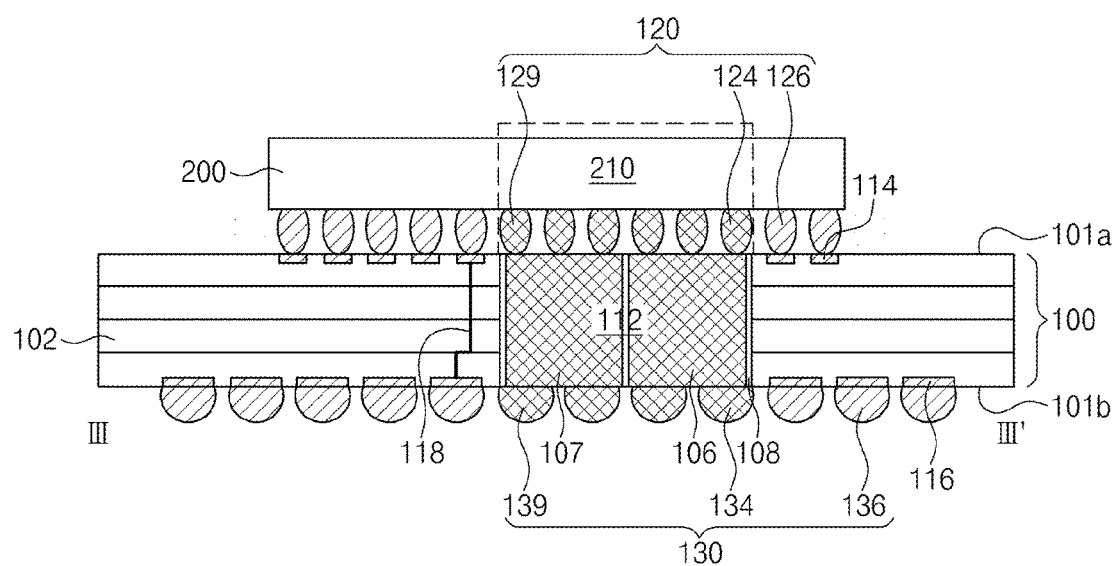
FIG. 6B is a cross-sectional view taken along a line III-III' of FIGS. 5A and 5B to illustrate the semiconductor package according to an example embodiment of the inventive concepts.

FIGS. 5A and 5B are plan views illustrating a semiconductor package according to an example embodiment of the inventive concepts. FIG. 6A is a cross-sectional view taken along a line II-II' of FIGS. 5A and 5B to illustrate the semiconductor package according to an example embodiment of the inventive concepts. FIG. 6B is a cross-sectional view taken along a line III-III' of FIGS. 5A and 5B to illustrate the semiconductor package according to an example embodiment of the inventive concepts.

In an example embodiment illustrated in FIGS. 5A, 5B, 6A, and 6B, the same elements as described in the first example embodiment will be indicated by the same reference numerals or the same reference designators. For the purpose of ease and convenience in explanation, the descriptions to the same elements as in the first example embodiment will be omitted or mentioned briefly.

Referring to FIGS. 5A, 5B, 6A, and 6B, a package substrate 100 may include a first thermal block 104, a second thermal block 106, a third thermal block 105, and a fourth thermal block 107. The first thermal block 104 and the third thermal block 105 may be disposed in the first region 110 of the package substrate 100, and the second thermal block 106 and the fourth thermal block 107 may be disposed in the second region 112 of the package substrate 100. The first thermal block 104 and the third thermal block 105 may be electrically insulated from each other by a barrier layer 108 disposed between the first and third thermal blocks 104 and 105. The second thermal block 106 and the fourth thermal block 107 may be electrically insulated from each other by a barrier layer 108 disposed between the second and fourth thermal blocks 106 and 107.

The first thermal block 104 may be in contact with first bumps 122 and first terminals 132. The second thermal block 106 may be in contact with second bumps 124 and the second terminals 134. The third thermal block 105 may be in contact with fourth bumps 128 and fourth terminals 138. The fourth thermal block 107 may be in contact with fifth bumps 129 and fifth terminals 139.

The first bumps 122, the fourth bumps 128, the first terminals 132, and the fourth terminals 138 may be provided with the same voltage. The second bumps 124, the fifth bumps 129, the second terminals 134, and the fifth terminals 139 may be provided with the same voltage. Here, a difference may occur between the voltage supplied to the first and fourth bumps 122 and 128 and the voltage supplied to the second and fifth bumps 124 and 129 Likewise, a difference may occur between the voltage supplied to the first and fourth terminals 132 and 138 and the voltage supplied to second and fifth terminals 134 and 139. Each of the first and fourth bumps 122 and 128 may be one of a power bump and a ground bump, and each of the second and fifth bumps 124 and 129 may be the other of the power bump and the ground bump. Each of the first and fourth terminals 132 and 138 may be one of a power terminal and a ground terminal, and each of the second and fifth terminals 134 and 139 may be the other of the power terminal and the ground terminal.

For example, if the first bumps 122 and the first terminals 132 are the power bumps and the power terminals, respectively, the first thermal block 104 may be a power path. If the fourth bumps 128 and the fourth terminals 138 are the power bumps and the power terminals, respectively, the third thermal block 105 may be the power path. If the second bumps 124 and the second terminals 134 are the ground bumps and the ground terminals, respectively, the second thermal block 106 may be a ground path. If the fifth bumps 129 and the fifth terminals 139 are the ground bumps and the ground terminals, respectively, the fourth thermal block 107 may be the ground path.

The thermal block may be a lump of metal, so an area of the thermal block may be greater than areas of interconnections and/or through-vias. The maximum temperature of the hot spot area 210 of the semiconductor chip 200 may be higher than the maximum temperatures of other areas of the semiconductor chip 200. Thus, a temperature difference between the maximum and minimum temperatures of the hot spot area 210 may be greater than a difference between the maximum and minimum temperatures of the other areas of the semiconductor chip 200. The thermal block adjacent to the hot spot area 210 may repeatedly shrink and expand because of the temperature difference. In addition, degrees of the shrinkage and expansion of the thermal block may increase as the area of the thermal block increases. Thus, cracks may occur in the thermal block.

In the present example embodiment, at least two thermal blocks may be formed in one region of the package substrate 100 to reduce or substantially prevent the above discussed disadvantage. For example, the first and third thermal blocks 104 and 105 may be formed in the first region 110 of the package substrate 100. The thermal blocks disposed in the one region may be in contact with the bumps and terminals which are supplied with the same voltage. Thus, the thermal blocks in the one region may be used as the power paths or the ground paths and may transmit the same voltage. Since the number of the thermal blocks is increased and the area of each of the thermal blocks is reduced in the one region, power characteristics of the power and the voltage may be maintained and the generation of cracks may be reduced or substantially prevented in the thermal blocks.

Figure 7A:
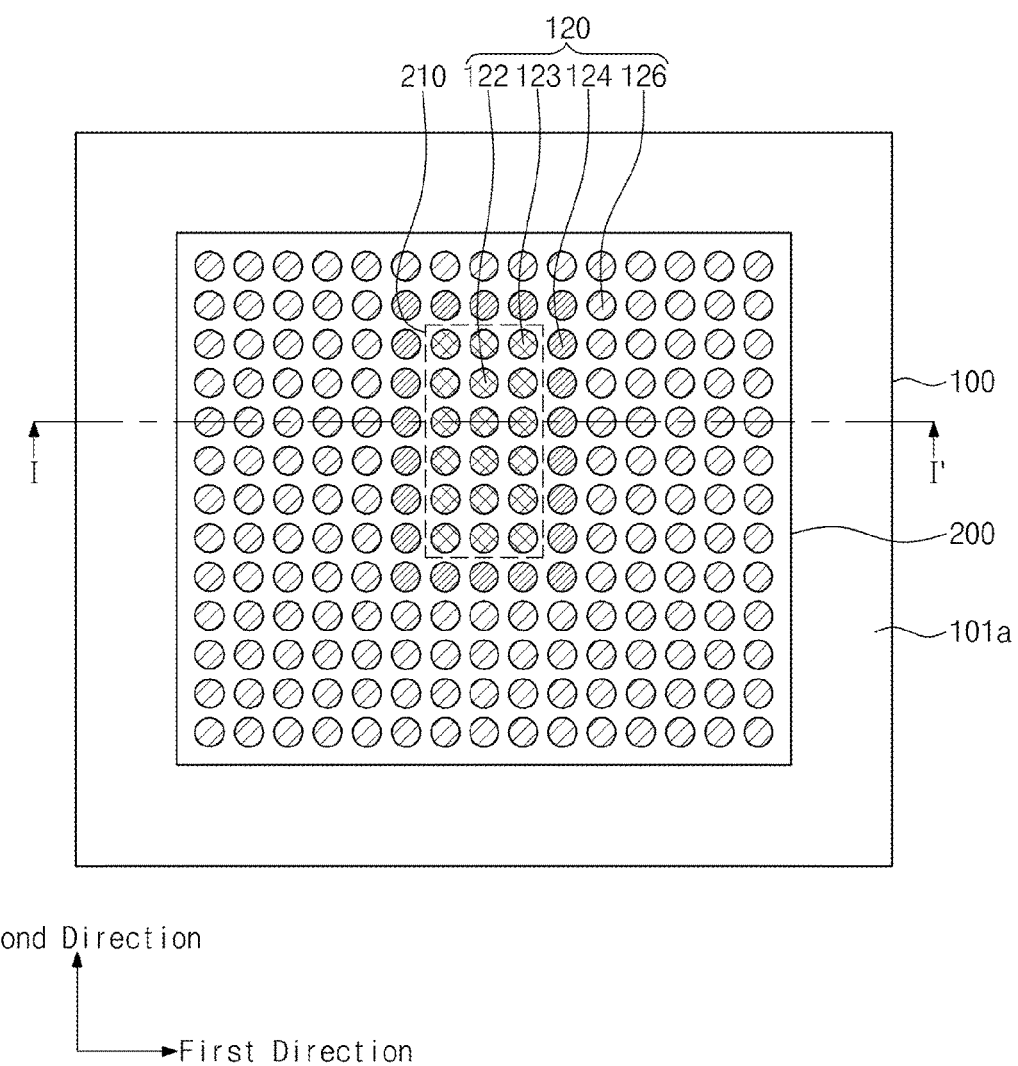
FIGS. 7A and 7B are plan views illustrating a semiconductor package according to an example embodiment of the inventive concepts.
Figure 7B:
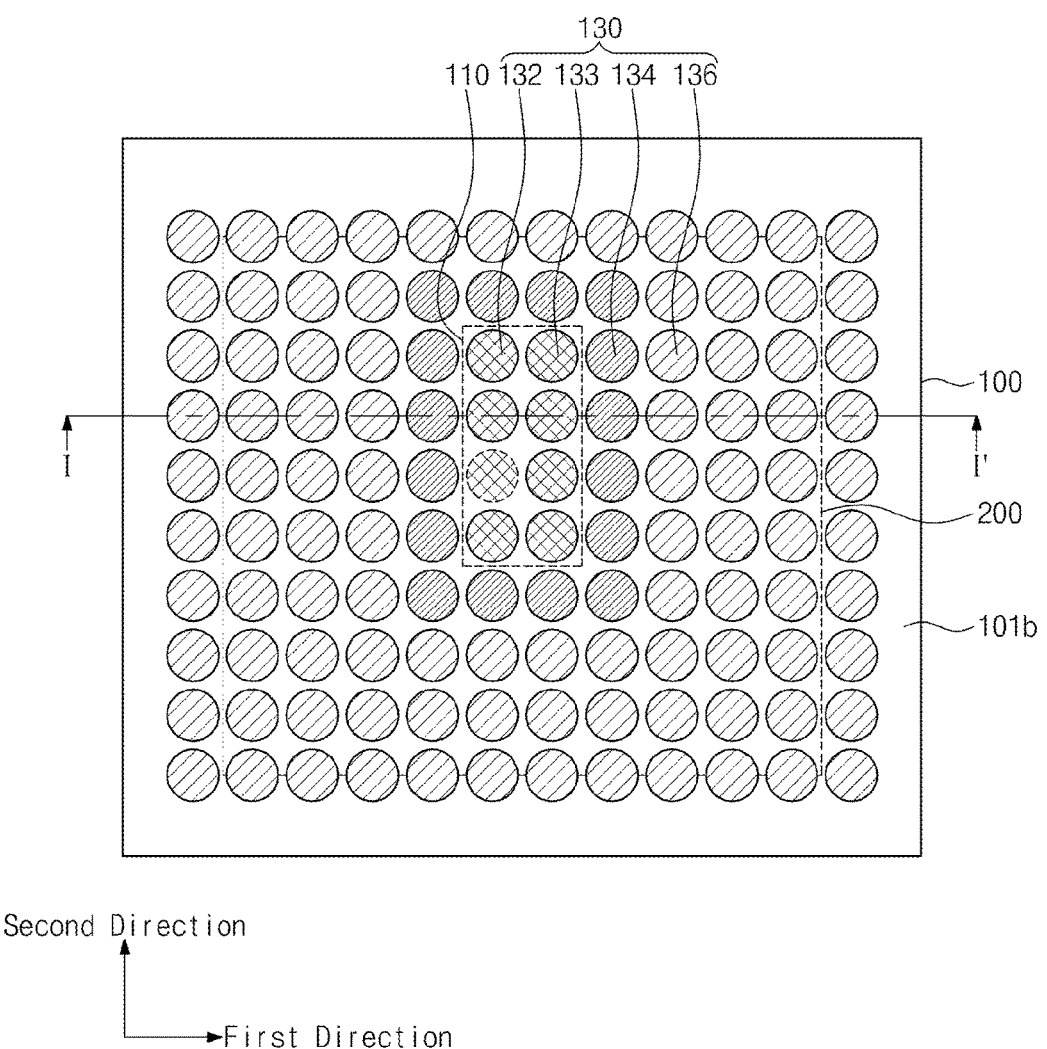
Figure 8:
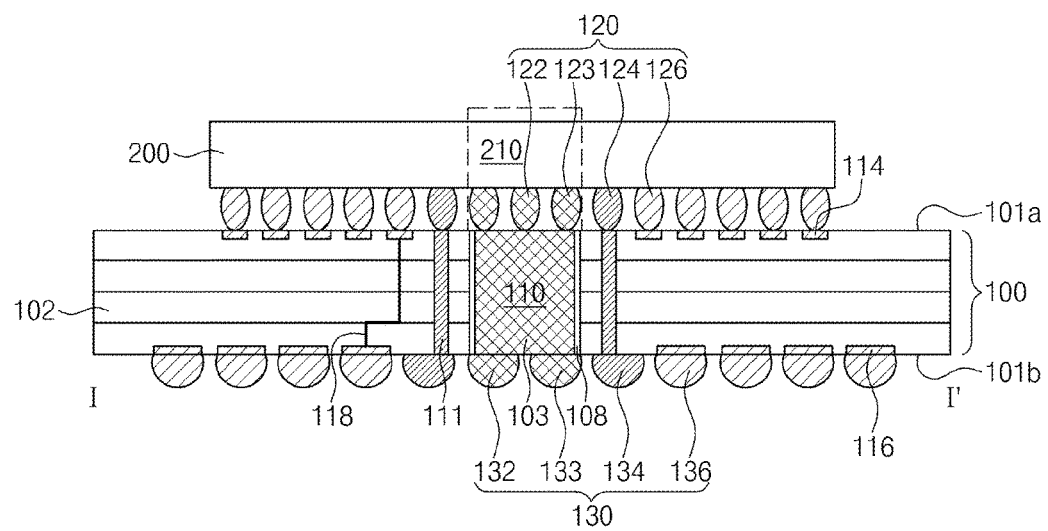
FIGS. 8 and 9 are cross-sectional views taken along a line I-I' of FIGS. 7A and 7B to illustrate semiconductor packages according to an example embodiment of the inventive concepts.
Figure 9:
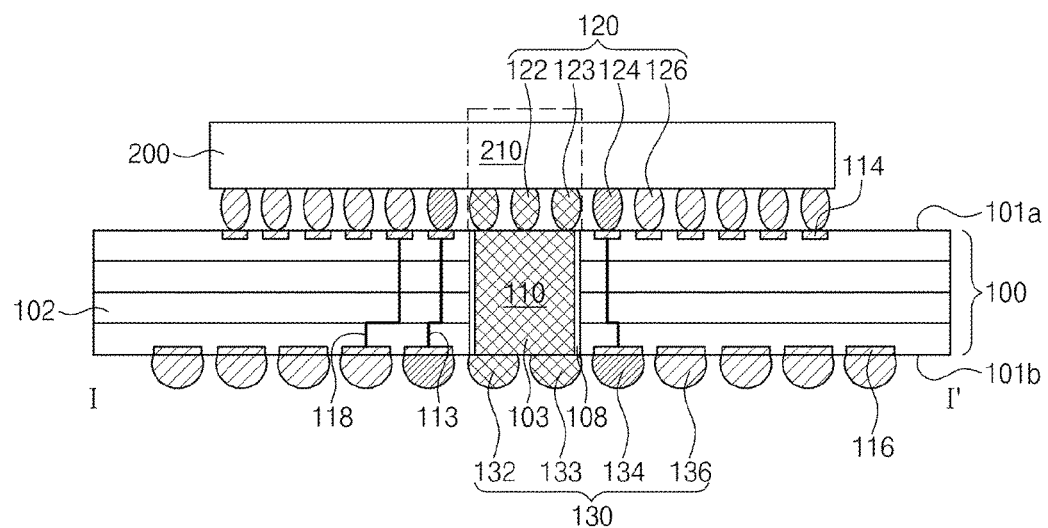

FIGS. 7A and 7B are plan views illustrating a semiconductor package according to an example embodiment of the inventive concepts. FIGS. 8 and 9 are cross-sectional views taken along a line I-I' of FIGS. 7A and 7B to illustrate semiconductor packages according to an example embodiment of the inventive concepts. In the example embodiment of FIGS. 7A, 7B, 8, and 9, the same elements as de example scribed in the example embodiment of FIGS. 1A and 1B will be indicated by the same reference numerals or the same reference designators. For the purpose of ease and convenience in explanation, the descriptions to the same elements as in the first example embodiment will be omitted or mentioned briefly.

Referring to FIGS. 7A, 7B, 8, and 9, the semiconductor chip 200 may be disposed on the package substrate 100. A thermal block 103 may be disposed in the package substrate 100. The thermal block 103 may penetrate the package substrate 100. The thermal block 103 may be disposed in a first region 110 of the package substrate 100 which vertically overlaps with a hot spot area 210 of the semiconductor chip 200. A top surface of the thermal block 103 may be exposed at the top surface 101a of the package substrate 100, and a bottom surface of the thermal block 103 may be exposed at the bottom surface 101b of the package substrate 100. For example, the top surface of the thermal block 103 may be disposed at the same level as the top surface 101a of the package substrate 100, and the bottom surface of the thermal block 103 may be disposed at the same level as the bottom surface 101b of the package substrate 100. A barrier layer 108 may be disposed between the thermal block 103 and the package substrate 100. At least one signal interconnection part 118 may be disposed in the package substrate 100.

At least one interconnecting part may be disposed in the package substrate 100. The interconnecting part may be a through-via 111 of FIG. 8 or a linking interconnection 113 of FIG. 9.

The semiconductor chip 200 may be mounted on the top surface 101a of the package substrate 100. In more detail, the semiconductor chip 200 may be mounted on the package substrate 100 by a flip chip bonding technique with bumps 120 interposed therebetween. The bumps 120 may be bonded on the top surface 101a of the package substrate 100.

The bumps 120 may be arranged in a first direction and a second direction perpendicular to the first direction when viewed from a plan view. The bumps 120 may include first bumps 122, second bumps 124, and third bumps 126. The first bumps 122 may vertically overlap with the hot spot area 210 of the semiconductor chip 200. Thus, the first bumps 122 may be in electrical contact with the thermal block 103. The first bumps 122 may include first edge bumps 123. The first edge bumps 123 may vertically overlap with the outermost region of the hot spot area 210. The second bumps 124 may surround the first edge bumps 123 when viewed from a plan view. The second bumps 124 may be in electrical contact with the through-vias 111 of FIG. 8 and/or the linking interconnections 113 of FIG. 9. The third bumps 126 may be in electrical contact with chip pads 114 which are disposed on the top surface 101a of the package substrate 100. Each of the first bumps 122 may be one of a power terminal or bump and a ground terminal or bump, and each of the second bumps 124 may be the other of the power terminal or bump and the ground terminal or bump. A voltage difference may occur between the first bump 122 and the second bump 124. For example, if the first bumps 122 are the power terminals or bumps, the second bumps 124 may be the ground terminals or bumps. The third bumps 126 may be signal bumps.

Terminals 130 may be disposed on the bottom surface 101b of the package substrate 100. The terminals 130 may be arranged in the first direction and the second direction when viewed from a plan view. The terminals 130 may include first terminals 132, second terminals 134, and third terminals 136. The first terminals 132 may vertically overlap with the first region 110 of the package substrate 100. The first terminals 132 may be in electrical contact with the thermal block 103, so the first bumps 122 may be electrically connected to the first terminals 132 through the thermal block 103. The first terminals 132 may include first edge terminals 133. The first edge terminals 133 may vertically overlap with the outermost region of the first region 110 of the package substrate 100. The second terminals 134 may surround the first edge terminals 133 when viewed from a plan view. The second terminals 134 may be in electrical contact with the through-vias 111 of FIG. 8 and/or the linking interconnections 113 of FIG. 9. Thus, the second terminals 134 may be electrically connected to the second bumps 124 through the through-vias 111 and/or the linking interconnections 113 connected to the chip pads 114. The third terminals 136 may be in electrical contact with terminal pads 116 which are disposed on the bottom surface 101b of the package substrate 100. The third bumps 126 may be electrically connected to the third terminals 136 through signal interconnection parts 118 disposed in the package substrate 100.

Each of the first terminals 132 may be one of a power terminal and a ground terminal, and each of the second terminals 134 may be the other of the power terminal and the ground terminal. A voltage difference may occur between the first terminals 132 and the second terminals 134. For example, if the first terminals 132 are the power terminals, the second terminals 134 may be the ground terminals. The third terminals 136 may be signal terminals.

If the first bumps 122 and the first terminals 132 are the power bumps and the power terminals, respectively, the thermal block 103 may be a power path. If the second bumps 124 and the second terminals 134 are the ground bumps and the ground terminals, respectively, the through-vias 111 and/or the linking interconnections 113 may be ground paths. The signal interconnection parts 118 connecting the third bumps 126 to the third terminals 136 may correspond to signal transmission paths.

According to the an example embodiment described above, the thermal block 103 may be used as the heat-exhausting path and the electrical connection path and the second bump 124 may be disposed between the first bump 122 and the third bump 126. Thus, a distance between the thermal block 103 and the third bump 126 transmitting a signal may be sufficient to improve power characteristics. For example, a Loop-L value between the power and the ground may be reduced and a guard ring effect may be obtained by a via-fence that is formed by the second bumps 124.

Figure 10A:
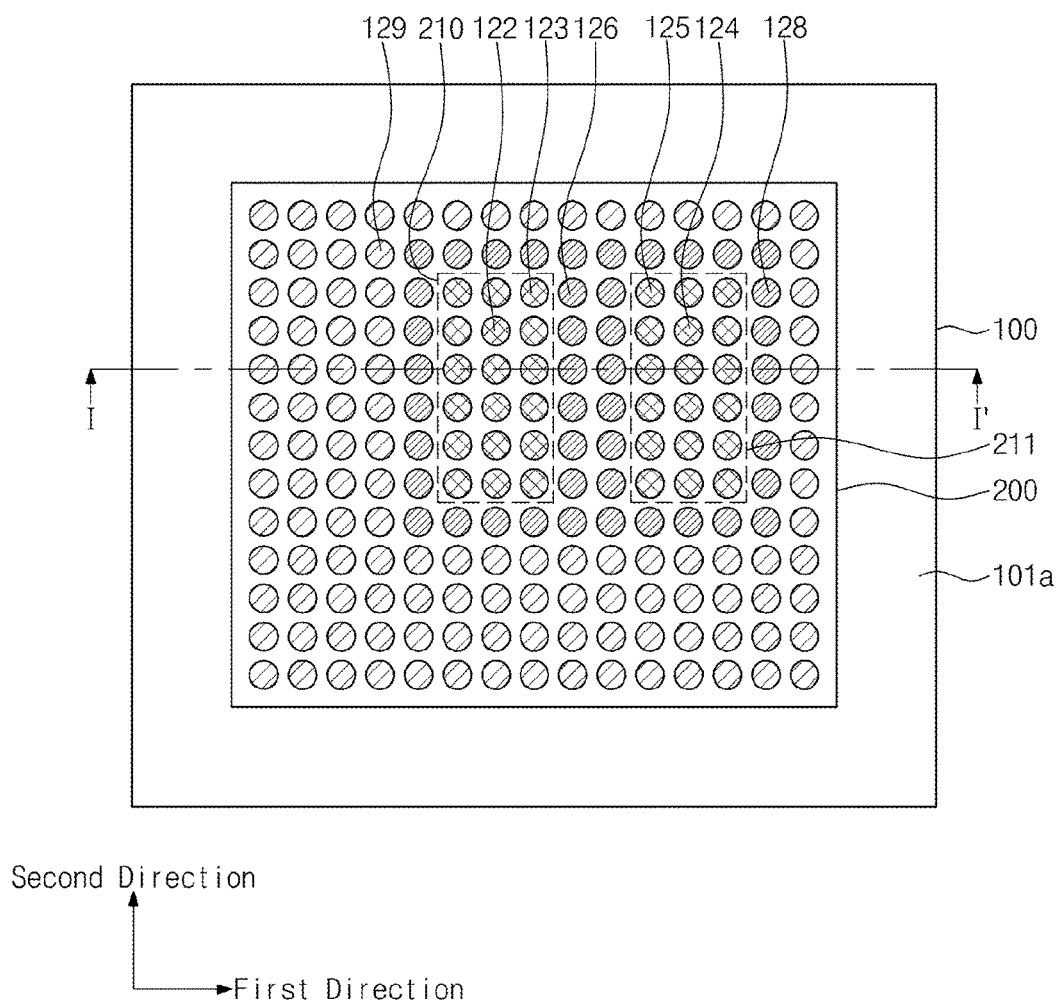
FIGS. 10A and 10B are plan views illustrating a semiconductor package according to an example embodiment of the inventive concepts.
Figure 10B:
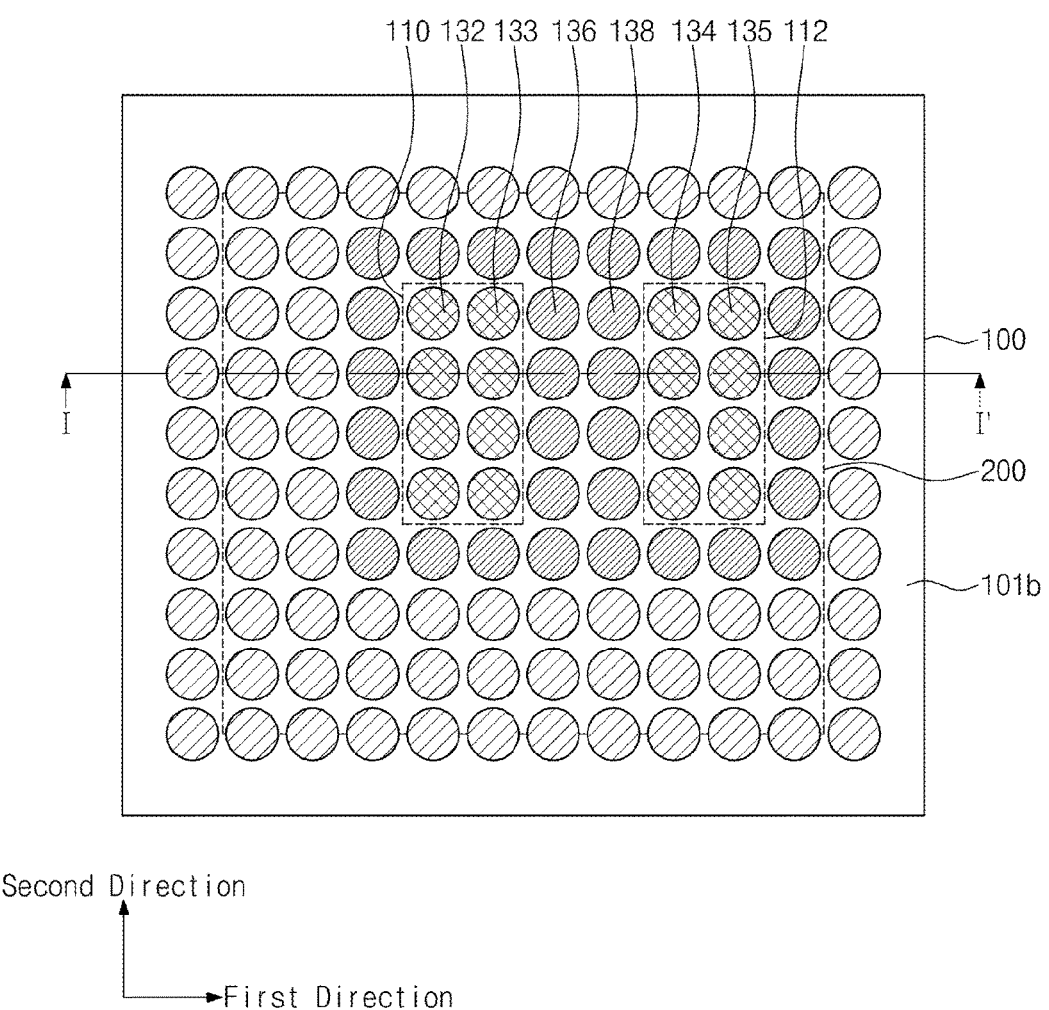
Figure 11:
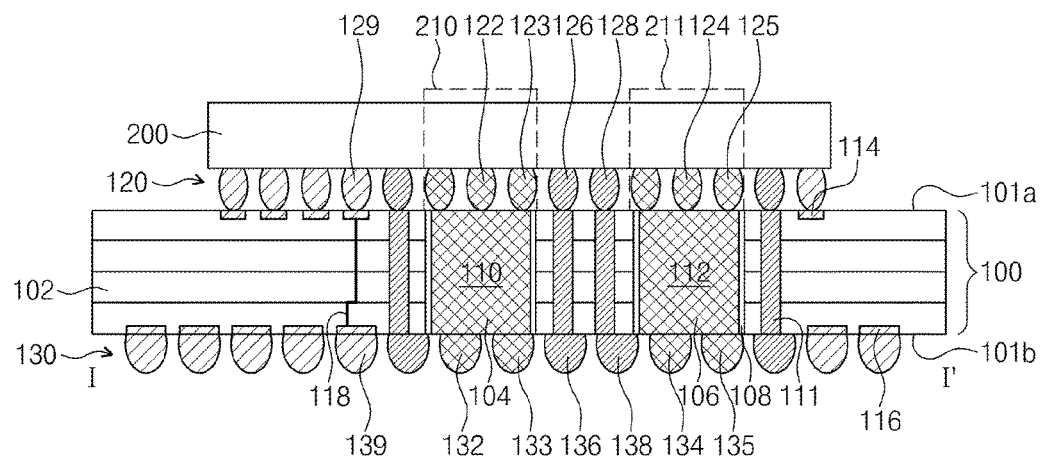
FIGS. 11 and 12 are cross-sectional views taken along a line I-I' of FIGS. 10A and 10B to illustrate semiconductor packages according to an example embodiment of the inventive concepts.
Figure 12:
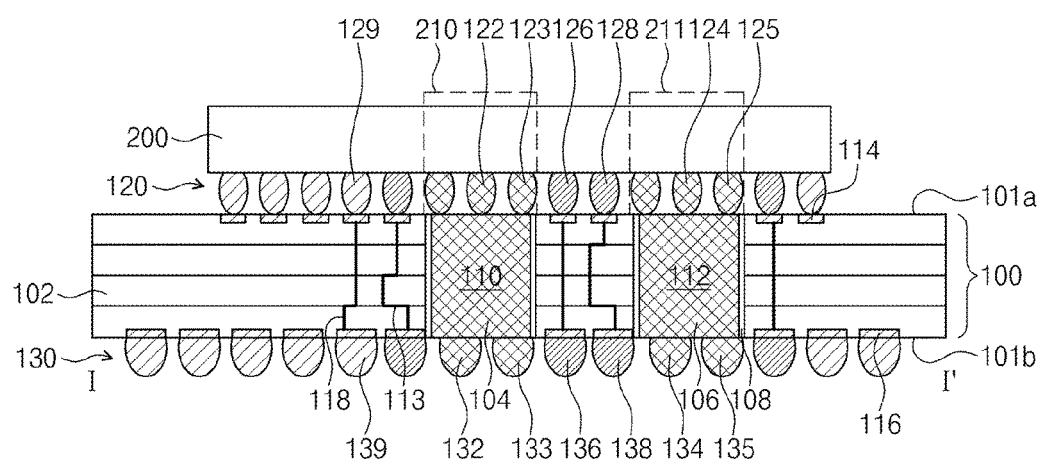

FIGS. 10A and 10B are plan views illustrating a semiconductor package according to an example embodiment of the inventive concepts. FIGS. 11 and 12 are cross-sectional views taken along a line I-I' of FIGS. 10A and 10B to illustrate semiconductor packages according to an example embodiment of the inventive concepts. In an example embodiment of FIGS. 10A, 10B, 11, and 12, the same elements as described in the example embodiment of FIGS. 1A and 1B will be indicated by the same reference numerals or the same reference designators. For the purpose of ease and convenience in explanation, the descriptions to the same elements as in the first example embodiment will be omitted or mentioned briefly.

Referring to FIGS. 10A, 10B, 11, and 12, a semiconductor chip 200 may be disposed on a package substrate 100. A first thermal block 104 and a second thermal block 106 may be disposed in the package substrate 100. The first and second thermal blocks 104 and 106 may be spaced apart from each other and may penetrate the package substrate 100. The first thermal block 104 may be disposed in a first region 110 of the package substrate 100 that vertically overlaps with a first hot spot area 210 of the semiconductor chip 200. The second thermal block 106 may be disposed in a second region 112 of the package substrate 100 that vertically overlaps with a second hot spot area 211 of the semiconductor chip 200. A top surface of the first thermal block 104 may be exposed at the top surface 101a of the package substrate 100, and a bottom surface of the first thermal block 104 may be exposed at the bottom surface 101b of the package substrate 100. A top surface of the second thermal block 106 may be exposed at the top surface 101a of the package substrate 100, and a bottom surface of the second thermal block 106 may be exposed at the bottom surface 101b of the package substrate 100. One or more signal interconnection parts 118 may be disposed in the package substrate 100.

At least one interconnecting part may be disposed in the package substrate 100. The interconnecting part may be a through-via 111 of FIG. 11 or a linking interconnection 113 of FIG. 12.

The semiconductor chip 200 may be mounted on the top surface 101a of the package substrate 100, and bumps 120 may be disposed between the semiconductor chip 200 and the package substrate 100. The bumps 120 may include first bumps 122, second bumps 124, third bumps 126, fourth bumps 128, and fifth bumps 129. The first bumps 122 may be connected to the first hot spot area 210 of the semiconductor chip 200 and may be in electrical contact with the first thermal block 104. The first bumps 122 may include first edge bumps 123. The first edge bumps 123 may be connected to the outermost region of the first hot spot area 210. The third bumps 126 may surround the first edge bumps 123 when viewed from a plan view. The second bumps 124 may be connected to the second hot spot area 211 of the semiconductor chip 200 and may be electrical contact with the second thermal block 106. The second bumps 124 may include second edge bumps 125. The second edge bumps 125 may be connected to the outermost region of the second hot spot area 211. The fourth bumps 128 may surround the second edge bumps 125. The fifth bumps 129 may be in contact with chip pads 114.

Each of the first, second, third, and fourth bumps 122, 124, 126, 128 may be a power terminal or bump or a ground terminal or bump. Each of the first bumps 122 may be one of the power terminal or bump and the ground terminal or bump, and each of the third bumps 126 the other of the power terminal or bump and the ground terminal or bump. Thus, a voltage difference may occur between the first bumps 122 and the third bumps 126. Each of the second bumps 124 may be one of the power terminal or bump and the ground terminal or bump, and each of the fourth bumps 128 may be the other of the power terminal or bump and the ground terminal or bump. Thus, a voltage difference may occur between the second bumps 124 and the fourth bumps 128. The voltage applied to the first bumps 122 may be equal to the voltage applied to the second bumps 124, and the voltage applied to the third bumps 126 may be equal to the voltage applied to the fourth bumps 128. Alternatively, a voltage difference may occur between the first bumps 122 and the second bumps 124, and a voltage difference may occur between the third bumps 126 and the fourth bumps 128. For example, if the first bumps 122 are the power terminals or bumps and the second bumps 124 are the ground terminals or bumps, the third bumps 126 may be the ground terminals or bumps and the fourth bumps 128 may be the power terminals or bumps. Alternatively, if the first bumps 122 and the second bumps 124 are the power terminals or bumps, the third bumps 126 and the fourth bumps 128 may be the ground terminals or bumps. The fifth bumps 129 may be signal bumps.

Terminals 130 may be disposed on the bottom surface 101b of the package substrate 100. The terminals 130 may include first terminals 132, second terminals 134, third terminals 136, fourth terminals 138, and fifth terminals 139. The first terminals 132 may vertically overlap with the first region 110 of the package substrate 100. Thus, the first terminals 132 may be in electrical contact with the first thermal block 104 so as to be electrically connected to the first bumps 122. The second terminals 134 may vertically overlap with the second region 112 of the package substrate 100. Thus, the second terminals 134 may be in electrical contact with the second thermal block 104 so as to be electrically connected to the second bumps 124. The first terminals 132 may include first edge terminals 133. The first edge terminals 133 may vertically overlap with the outermost region of the first region 110 of the package substrate 100. The third terminals 136 may surround the first edge terminals 133 when viewed from a plan view. The second terminals 134 may include second edge terminals 135. The second edge terminals 135 may vertically overlap with the outermost region of the second region 112 of the package substrate 100. The fourth terminals 138 may surround the second edge terminals 135 when viewed from a plan view. The third and fourth terminals 136 and 138 may be electrically connected to the third and fourth bumps 126 and 128 through the through-vias 111 of FIG. 11 and/or the linking interconnections 113 of FIG. 12. The fifth terminals 139 may be in electrical contact with terminal pads 116 which are disposed on the bottom surface 101b of the package substrate 100. The fifth terminals 139 may be electrically connected to the fifth bumps 129 through signal interconnection parts 118 disposed in the package substrate 100.

Each of the first, second, third, and fourth terminals 132, 134, 136, 138 may be a power terminal or a ground terminal. In more detail, each of the first terminals 132 may be one of the power terminal and the ground terminal, and each of the third terminals 136 may be the other of the power terminal and the ground terminal. Thus, a voltage difference may occur between the first terminals 132 and the third terminals 136. Each of the second terminals 134 may be one of the power terminal and the ground terminal, and each of the fourth terminals 138 may be the other of the power terminal and the ground terminal. Thus, a voltage difference may occur between the second terminals 134 and the fourth terminals 138. The voltage applied to the first terminals 132 may be equal to the voltage applied to the second terminals 134, and the voltage applied to the third terminals 136 may be equal to the voltage applied to the fourth terminals 138. Alternatively, a voltage difference may occur between the first terminals 132 and the second terminals 134, and a voltage difference may occur between the third terminals 136 and the fourth terminals 138. For example, if the first terminals 132 are the power terminals and the second terminals 134 are the ground terminals, the third terminals 136 may be the ground terminals and the fourth terminals 138 may be the power terminals. Alternatively, if the first and second terminals 132 and 134 are the power terminals, the third and fourth terminals 136 and 138 may be the ground terminals. The fifth terminals 139 may be signal terminals.

For example, if the first bumps 122 and the first terminals 132 are the power bumps and the power terminals, the first thermal block 104 may correspond to a power path. If the second bumps 124 and the second terminals 134 are the ground bumps and the grounder terminals, the second thermal block 106 may correspond to a ground path. If the third bumps 126 and the third terminals 136 are the ground bumps and the ground terminals, the through-vias 111 and/or the linking interconnections 113 connected thereto may be ground paths. If the fourth bumps 128 and the fourth terminals 138 are the power bumps and the power terminals, the through-vias 111 and/or the linking interconnections 113 connected thereto may be power paths. The signal interconnections parts 118 connected to the fifth bumps and terminals 129 and 139 may correspond to signal transmission paths.

Figure 13A:
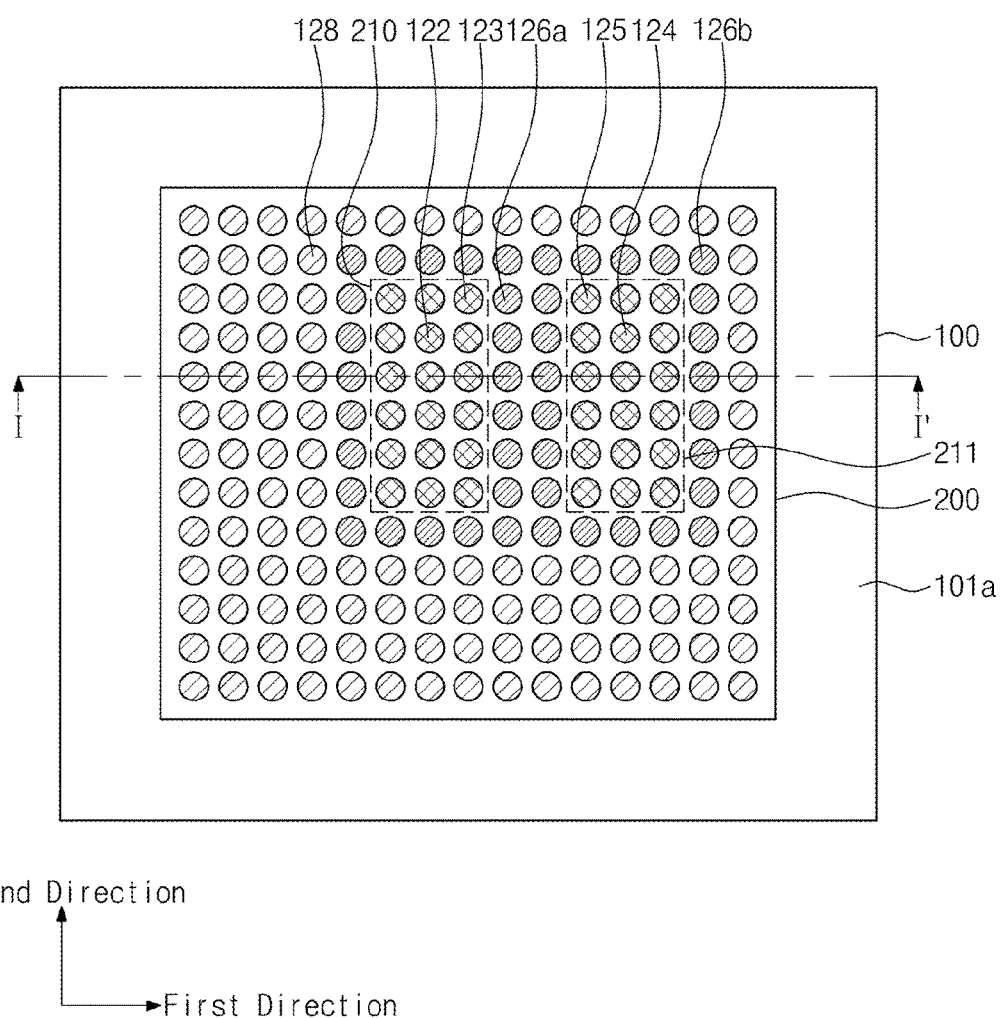
FIGS. 13A and 13B are plan views illustrating a semiconductor package according to an example embodiment of the inventive concepts.
Figure 13B:
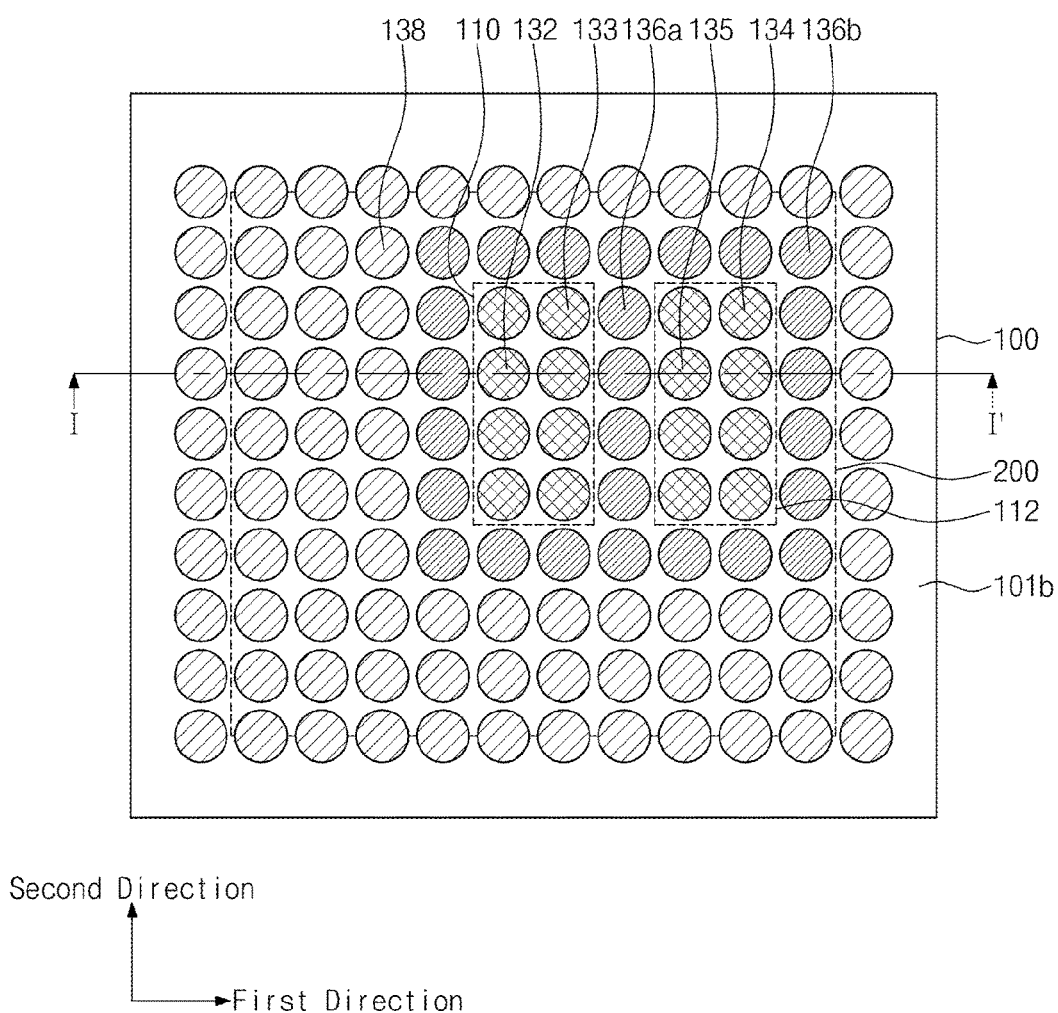
Figure 14:
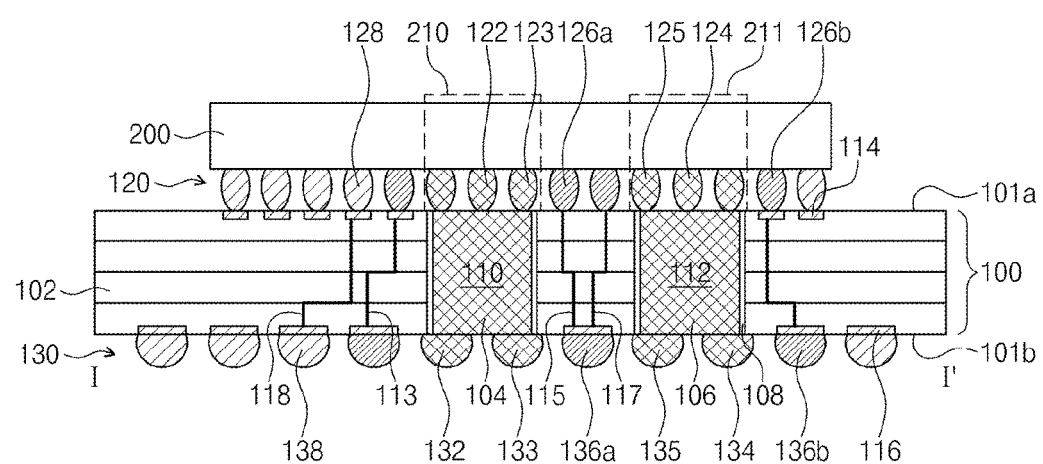
FIG. 14 is a cross-sectional view taken along a line I-I' of FIGS. 13A and 13B to illustrate the semiconductor package according to an example embodiment of the inventive concepts.

FIGS. 13A and 13B are plan views illustrating a semiconductor package according to an example embodiment of the inventive concepts. FIG. 14 is a cross-sectional view taken along a line I-I' of FIGS. 13A and 13B to illustrate the semiconductor package according to an example embodiment of the inventive concepts. In an example embodiment of FIGS. 13A, 13B, and 14, the same elements as described in previous example embodiments will be indicated by the same reference numerals or the same reference designators. For the purpose of ease and convenience in explanation, the descriptions to the same elements as in previous example embodiments will be omitted or mentioned briefly.

Referring to FIGS. 13A, 13B, and 14, the first and second thermal blocks 104 and 106 may be disposed in the package substrate 100. The first thermal block 104 may be disposed in the first region 110 of the package substrate 100 which is adjacent to the first hot spot area 210 of the semiconductor chip 200. The second thermal block 106 may be disposed in the second region 112 of the package substrate 100 which is adjacent to the second hot spot area 211 of the semiconductor chip 200. The first and second hot spot areas 210 and 211 may be spaced apart from each other.

Bumps 120 may be disposed on the top surface 101a of the package substrate 100. The bumps 120 may include first bumps 122, second bumps 124, third bumps 126a and 126b, and fourth bumps 128. The first bumps 122 may be connected to the first hot spot area 210 and may be in electrical contact with the first thermal block 104. The second bumps 124 may be connected to the second hot spot area 211 and may be in electrical contact with the second thermal block 106. The third bumps 126a and 126b may surround first edge bumps 123 of the first bumps 122 and second edge bumps 125 of the second bumps 124 when viewed from a plan view. The first edge bumps 123 may vertically overlap with the outermost region of the first hot spot area 210, and the second edge bumps 125 may vertically overlap with the outermost region of the second hot spot area 211. As illustrated in FIG. 13A, some of the third bumps 126a may be disposed between the first and second hot spot areas 210 and 211 and others of the third bumps 126b may be disposed around the first and second hot spot areas 210 and 211 when viewed from a plan view. The third bumps 126a disposed between the first and second hot spot areas 210 and 211 in a plan view may be arranged to constitute a plurality of columns. In an example embodiment, the third bumps 126a between the first and second hot spot areas 210 and 211 may be arranged along two columns when viewed from a plan view.

The same voltage may be applied to the first bumps 122 and the second bumps 124. On the other hand, a voltage difference may occur between the first bump 122 and each of the third bumps 126a and 126b and between the second bump 124 and each of the third bumps 126a and 126b. For example, if the first bumps 122 and the second bumps 124 are power terminals or bumps, the third bumps 126a and 126b may be ground terminals or bumps. The fourth bumps 128 may be signal bumps.

Terminals 130 may be disposed on the bottom surface 101b of the package substrate 100. The terminals 130 may include first terminals 132, second terminals 134, third terminals 136a and 136b, and fourth terminals 138. The first terminals 132 may vertically overlap with the first region 110 of the package substrate 100 so as to be electrically connected to the first thermal block 104. The second terminals 134 may vertically overlap with the second region 112 of the package substrate 100 so as to be electrically connected to the second thermal block 106. The third terminals 136a and 136b may surround first edge terminals 133 of the first terminals 132 and second edge terminals 135 of the second edge terminals 134. The first edge terminals 133 may vertically overlap with the outermost region of the first region 110 of the package substrate 100, and the second edge terminals 135 may vertically overlap with the outermost region of the second region 112 of the package substrate 100. As illustrated in FIG. 13B, some 136a of the third terminals may be disposed between the first and second regions 110 and 112 and others 136b of the third terminals may be disposed around the first and second regions 110 and 112 when viewed from a plan view. The third terminals 136a between the first and second regions 110 and 112 may be arranged to constitute one or more columns when viewed from a plan view. In an example embodiment, the third terminals 136a between the first and second regions 110 and 112 may be arranged to constitute one column when viewed from a plan view. In some example embodiments, the number of the columns of the third bumps 126a between the first and second hot spot areas 210 and 211 may be more than the number of the column of the third terminals 136a between the first and second regions 110 and 112 when viewed from a plan view.

The same voltage may be applied to the first and second terminals 132 and 134. On the other hand, a voltage difference may occur between the first terminal 132 and each of the third terminals 136a and 136b and between the second terminal 134 and each of the third terminals 136a and 136b. For example, if the first and second terminals 132 and 134 are power terminals, the third terminals 136a and 136b may be ground terminals. The fourth terminals 138 may be signal terminals.

For example, the first bumps 122 may be electrically connected to the first terminals 132 through the first thermal block 104, and the second bumps 124 may be electrically connected to the second terminals 134 through the second thermal block 106. The third bumps 126a between the first and second hot spot areas 210 and 211 may be electrically connected to the third terminal 136a disposed between the first and second regions 110 and 112 through first and second interconnecting parts 115 and 117. The first interconnecting part 115 may be connected to one of the third bumps 126a, and the second interconnecting part 117 may be connected to another of the third bumps 126a. The third bumps 126b not connected to the first and second interconnecting parts 115 and 117 may be electrically connected to the third terminals 136b, not connected to the first and second interconnecting parts 115 and 117, through linking interconnections 113. If the first and second thermal blocks 104 and 106 are the power paths, the first and second interconnecting part 115 and 117 and the linking interconnections 113 may be the ground paths. Signal interconnection parts 118 electrically connecting the fourth bumps 128 to the fourth terminals 138 may correspond to signal transmission paths.

Figure 15:
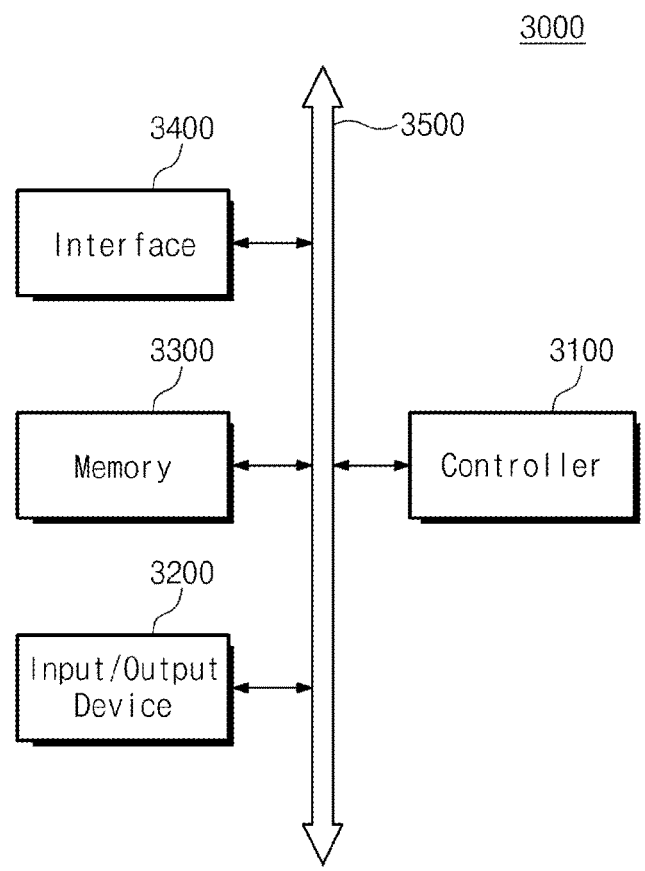
FIG. 15 is a schematic block diagram illustrating an example embodiment of an electronic system including a semiconductor package according to example embodiments of the inventive concepts.
Figure 16:
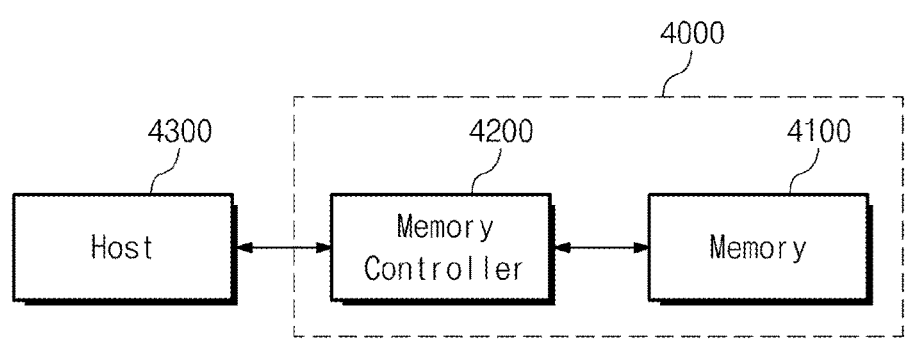
FIG. 16 is a schematic block diagram illustrating an example embodiment of a memory system including a semiconductor package according to example embodiments of the inventive concepts.

FIG. 15 is a schematic block diagram illustrating an example embodiment of an electronic system including a semiconductor package according to example embodiments of the inventive concepts. FIG. 16 is a schematic block diagram illustrating an example embodiment of a memory system including a semiconductor package according to example embodiments of the inventive concepts.

Referring to FIG. 15, an electronic system 3000 may include a controller 3100, an input/output (I/O) device 3200, and a memory device 3300. The controller 3100, the I/O device 3200, and the memory device 3300 may communicate with each other through a data bus 3500. The data bus 3500 may correspond to a path through which electrical data are transmitted. For example, the controller 3100 may include at least one of a microprocessor, a digital signal processor, a microcontroller, or another logic device having the same function as any one thereof. At least one of the controller 3100 and the memory device 3300 may include at least one of the semiconductor packages according to the aforementioned embodiments of the inventive concepts. The I/O device 3200 may include a keypad, a keyboard and/or a display device. The memory device 3300 is a device storing data. The memory device 3300 may store data and/or commands executed by the controller 3100. The memory device 3300 may include a volatile memory device and/or a non-volatile memory device. In an embodiment, the memory device 3300 may include a flash memory device. For example, the flash memory device implemented with the semiconductor package according to the inventive concepts may be installed in the electronic system 3000 such as a mobile device and a desk top computer. The flash memory device may be realized as a solid state disk (SSD). In this case, the electronic system 3000 may stably store massive data in the flash memory device. The electronic system 3000 may further include an interface unit 3400 that is used to transmit electrical data to a communication network and/or to receive electrical data from the communication network. The interface unit 3400 may operate by wireless or cable. For example, the interface unit 3400 may include an antenna or a wireless/cable transceiver. Although not shown in the drawings, the electronic system 3000 may further include an application chipset and/or a camera image processor (CIS).

The electronic system 3000 may be realized as a mobile system, a personal computer, an industrial computer, or a logic system performing various functions. For example, the mobile system may be a personal digital assistant (PDA), a portable computer, a web tablet, a mobile phone, a wireless phone, a laptop computer, a memory card, a digital music player, or other electronic products receiving and/or transmitting information data. If the electronic system 3000 is a device capable of performing wireless communication, the electronic system 3000 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

Referring to FIG. 16, a memory system 4000 may include a non-volatile memory device 4100 and a memory controller 4200. The non-volatile memory device 4100 and the memory controller 4200 may store logical data and/or read stored data. The non-volatile memory device 4100 may include at least one of the semiconductor packages according to the aforementioned embodiments of the inventive concepts. The memory controller 4200 may control the non-volatile memory device 4100 to read stored data and/or to store data in response to read request and/or write request of a host 4300.

According to embodiments of the inventive concepts, one thermal block may be used as one of the power path and the ground path, and another thermal block and/or the interconnecting part adjacent to the one thermal block may be used as the other of the power path and the ground path. In other words, the thermal block may be used as the heat-exhausting path and the electrical connection path at the same time, so the area of the package substrate may be effectively used. In addition, the distance between the power and the ground may be shortened, so the power characteristics of the semiconductor package may be improved.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A semiconductor package comprising:
a package substrate including a first region;
a first thermal block in the first region of the package substrate, the first thermal block exposed at a top surface and at a bottom surface of the package substrate;
a semiconductor chip on the package substrate;

a plurality of bumps between the package substrate and the semiconductor chip, the plurality of bumps including first bumps in contact with the first thermal block and second bumps surrounding the first bumps;

a plurality of terminals on the bottom surface of the package substrate, the plurality of terminals including first terminals in contact with the first thermal block; and a capacitor embedded in the package substrate and laterally spaced apart from the first thermal block, wherein the first thermal block is one of a power path and a ground path;

wherein the capacitor has a dielectric layer embedded in the package substrate and electrodes disposed on sidewalls of the dielectric layer;

wherein one of the electrodes is exposed at the top surface of the package substrate; and wherein the one of the electrodes is in direct contact with one of the second bumps.

2. The semiconductor package of claim 1, wherein the package substrate further includes a second region spaced apart from the first region, the semiconductor package further comprising:

a second thermal block in the second region of the package substrate.

3. The semiconductor package of claim 2, wherein the plurality of terminals further include second terminals, and wherein the second bumps and the second terminals are in contact with the second thermal block.

4. The semiconductor package of claim 3, wherein the first bumps include first edge bumps vertically overlapping with an outermost region of the first region, wherein the plurality of bumps further include third bumps surrounding the first edge bumps in a plan view, wherein the second bumps include second edge bumps vertically overlapping with an outermost region of the second region, and wherein the plurality of bumps further include fourth bumps surrounding the second edge bumps in a plan view.

5. The semiconductor package of claim 4, wherein the package substrate comprises:

first interconnecting parts electrically connecting the third bumps to some of the plurality of terminals; and second interconnecting parts electrically connecting the fourth bumps to other ones of the plurality of terminals, wherein at least one of the first thermal block and the second interconnecting part is one of the power path and the ground path, and wherein at least one of the second thermal block and the first interconnecting part is the other of the power path and the ground path.

6. The semiconductor package of claim 5, wherein the first terminals include first edge terminals vertically overlapping with the outermost region of the first region, wherein the plurality of terminals include third terminals surrounding the first edge terminals in a plan view, wherein the second terminals include second edge terminals vertically overlapping with the outermost region of the second region, wherein the plurality of terminals include fourth terminals surrounding the second edge terminals in a plan view, wherein the third terminals are some of the plurality of terminals that are connected to the first interconnecting parts, and wherein the fourth terminals are some of the plurality of terminals that are connected to the second interconnecting parts.

7. The semiconductor package of claim 3, wherein the first bumps include first edge bumps vertically overlapping with an outermost region of the first region, the plurality of bumps further include third bumps surrounding the first edge bumps in a plan view, the second bumps include second edge bumps vertically overlapping with an outermost region of the second region, the plurality of bumps further include fourth bumps surrounding the second edge bumps in a plan view, the package substrate comprises: first interconnecting parts electrically connecting the third bumps to some of the plurality of terminals; and second interconnecting parts electrically connecting the fourth bumps to other ones of the plurality of terminals, and the second thermal block is one of the power path and the ground path, and at least one of the first and second interconnecting parts is the other of the power path and the ground path.

8. The semiconductor package of claim 7, wherein the first terminals include first edge terminals vertically overlapping with the outermost region of the first region, wherein the second terminals include second edge terminals vertically overlapping with the outermost region of the second region, wherein the plurality of terminals include third terminals surrounding the first edge terminals and the second edge terminals in a plan view, wherein the third terminals are some of the plurality of terminals that are connected to the first and second interconnecting parts.

9. The semiconductor package of claim 1, wherein the first bumps include first edge bumps vertically overlapping with an outermost region of the first region and, wherein the second bumps are connected to the other of the power path and the ground path.

10. The semiconductor package of claim 9, wherein the first terminals include first edge terminals vertically overlapping with the outermost region of the first region, wherein the plurality of terminals further include second terminals surrounding the first edge terminals, and wherein the second terminals are electrically connected to the second bumps.

11. The semiconductor package of claim 10, wherein the package substrate comprises: interconnecting parts electrically connecting the second bumps to the second terminals, and wherein at least one of the interconnecting parts is the other of the power path and the ground path.

12. The semiconductor package of claim 1, wherein the first thermal block vertically overlaps a hot spot area of the semiconductor chip; and wherein a distance between the hot spot area and the first thermal block is smaller than a distance between the hot spot area and the capacitor.

13. A semiconductor package comprising:

a package substrate including a first region and a second region;

a first thermal block in the first region of the package substrate, the first thermal block exposed at a top surface and a bottom surface of the package substrate;

a second thermal block in the second region of the package substrate, the second thermal block exposed at the top surface and the bottom surface of the package substrate;

a semiconductor chip on the package substrate;

a plurality of bumps between the package substrate and the semiconductor chip, the plurality of bumps including first bumps in contact with the first thermal block, second bumps in contact with the second thermal block, and third bumps surrounding the first and second bumps; and a capacitor embedded in the package substrate and laterally spaced apart from the first thermal block and the second thermal block, wherein the capacitor has a dielectric layer embedded in the package substrate and electrodes on sidewalls of the dielectric layer;

wherein one of the electrodes is exposed at the top surface of the package substrate; and wherein the one of the electrodes is in direct contact with the third bumps.

14. The semiconductor package of claim 13, wherein a first surface of at least one of the first thermal block and the second thermal block, and the top surface of the package substrate are substantially coplanar.

15. The semiconductor package of claim 14, further comprising a plurality of terminals at the bottom surface of the package substrate, wherein the plurality of terminals comprises:

first and second terminals in contact with a second surface of the at least one of the first thermal block and the second thermal block; and third terminals in contact with the bottom surface of the package substrate;

the second surface of the at least one of the first thermal block and the second thermal block, and the bottom surface of the package substrate being substantially coplanar.

16. The semiconductor package of claim 15, wherein the first terminals are in contact with the first thermal block; and the second terminals are in contact with the second thermal block.

17. The semiconductor package of claim 15, wherein at least one of the plurality of bumps are in electrical contact with at least one of the plurality of terminals via at least one of one or more signal interconnection parts, and one or more through-vias.

18. The semiconductor package of claim 13, further comprising a second capacitor embedded in the package substrate and laterally spaced apart from the first thermal block and the second thermal block, wherein the second capacitor has a dielectric layer embedded in the package substrate and electrodes on sidewalls of the dielectric layer; and wherein one of the electrodes is in contact with one of the third bumps.

\* \* \* \* \*